US012701677B2

(12) United States Patent
Heher et al.

(10) Patent No.: US 12,701,677 B2
(45) Date of Patent: Aug. 4, 2026

(54) THERMAL MANAGEMENT SYSTEM

(71) Applicant: Transportation IP Holdings, LLC, Norwalk, CT (US)

(72) Inventors: Brett Heher, Pittsburgh, PA (US); John D. Walker, Erie, PA (US)

(73) Assignee: Transportation IP Holdings, LLC, Norwalk, CT (US)

( * ) Notice: Subject to any disclaimer, the term of this patent is extended or adjusted under 35 U.S.C. 154(b) by 251 days.

(21) Appl. No.: 18/544,770

(22) Filed: Dec. 19, 2023

(65) Prior Publication Data

US 2024/0357770 A1     Oct. 24, 2024

Related U.S. Application Data

(60) Provisional application No. 63/497,479, filed on Apr. 21, 2023.

(51) Int. Cl.
| | |
|---|---|
| *B33Y 80/00* | (2015.01) |
| *H05K 7/20* | (2006.01) |
| *B33Y 10/00* | (2015.01) |

(52) U.S. Cl.
CPC .......... *H05K 7/20509* (2013.01); *B33Y 80/00* (2014.12); *H05K 7/20127* (2013.01); *B33Y 10/00* (2014.12)

(58) Field of Classification Search
CPC ........... H05K 7/20509; H05K 7/20127; B33Y 80/00; B33Y 10/00
USPC ........................................................ 361/704
See application file for complete search history.

(56) References Cited

U.S. PATENT DOCUMENTS

| | | | | |
|---|---|---|---|---|
| 4,935,864 A | * | 6/1990 | Schmidt ................. | H01L 23/38 |
| | | | | 257/467 |
| 5,032,897 A | * | 7/1991 | Mansuria ................ | H01L 23/38 |
| | | | | 257/712 |
| 5,419,780 A | * | 5/1995 | Suski ..................... | H10N 10/13 |
| | | | | 136/224 |
| 5,724,818 A | * | 3/1998 | Iwata ..................... | H01L 23/38 |
| | | | | 62/3.7 |
| 5,731,954 A | * | 3/1998 | Cheon ...................... | G06F 1/20 |
| | | | | 174/15.1 |
| 5,946,188 A | * | 8/1999 | Rochel .................... | H01L 23/38 |
| | | | | 174/16.3 |

(Continued)

*Primary Examiner* — Anatoly Vortman
(74) *Attorney, Agent, or Firm* — K&L Gates LLP

(57)     ABSTRACT

A thermal management system may include a solid state heat pump thermally coupled with a component and a first thermal management assembly thermally coupled with the heat pump. The first thermal management assembly may conduct the thermal energy between the component and an external environment via the heat pump. The system may include a second thermal management assembly thermally coupled with the component to conduct the thermal energy between the component and the external environment. The first thermal management assembly can conduct a first portion of the thermal energy between the component and the external environment via the solid state heat pump. The second thermal management assembly may conduct a second portion of the thermal energy between the component and the external environment. These portions of thermal energy can create convection movement of a working fluid between the thermal management assemblies.

19 Claims, 21 Drawing Sheets

(56)                 References Cited

U.S. PATENT DOCUMENTS

| | | | | |
|---|---|---|---|---|
| 5,992,511 | A * | 11/1999 | Kodaira | H01L 23/467 |
| | | | | 165/185 |
| 6,094,919 | A * | 8/2000 | Bhatia | H01L 23/38 |
| | | | | 62/3.2 |
| 6,711,904 | B1 * | 3/2004 | Law | H01L 23/34 |
| | | | | 62/3.2 |
| 7,480,140 | B2 * | 1/2009 | Hara | H05K 7/20145 |
| | | | | 361/709 |
| 7,990,699 | B2 * | 8/2011 | Lian | F28D 15/0275 |
| | | | | 361/679.52 |
| 8,638,559 | B2 * | 1/2014 | Barina | H01L 23/427 |
| | | | | 361/679.52 |
| 9,245,820 | B2 * | 1/2016 | Goldrian | H01L 23/473 |
| 12,369,271 | B2 * | 7/2025 | Holland | H05K 7/20272 |
| 2008/0084668 | A1 * | 4/2008 | Campbell | H05K 7/20509 |
| | | | | 257/E23.098 |
| 2008/0291630 | A1 * | 11/2008 | Monh | H01L 23/427 |
| | | | | 361/700 |
| 2009/0002951 | A1 * | 1/2009 | Legen | H01L 23/427 |
| | | | | 165/104.33 |
| 2009/0277616 | A1 * | 11/2009 | Cipolla | H01L 23/473 |
| | | | | 165/104.33 |
| 2010/0025010 | A1 * | 2/2010 | Cipolla | H01L 23/4093 |
| | | | | 165/47 |
| 2021/0302074 | A1 * | 9/2021 | Artman | F25B 21/04 |
| 2021/0302075 | A1 * | 9/2021 | Bell | F25B 21/04 |

* cited by examiner

1900

1902

THERMAL MANAGEMENT SYSTEM

CROSS-REFERENCE TO RELATED APPLICATIONS

This application claims priority to U.S. Provisional Application No. 63/497,479 (filed 21 Apr. 2023), the entire disclosure of which is incorporated herein by reference.

BACKGROUND

Technical Field

The subject matter described herein relates to systems and methods that cool or heat components, such as electronic components, using natural convection in smaller spaces and/or for larger temperature differences by which the components are cooled or heated.

Discussion of Art

Free convection or natural convection heat sinks may be used to cool low power electronic equipment (e.g., computing processors). Free or natural convection can involve transferring thermal energy in a fluid that is caused by differences in density within the fluid due to temperature differences. As the fluid is heated, the fluid may expand and become less dense, causing the fluid to rise or move. As the fluid cools and becomes denser, the fluid may sink or move in an opposite direction. This may create a circulating flow known as a natural convection current of the fluid.

The flow of the fluid (e.g., air) across a free or natural convection heat exchanger may be limited by natural convection properties. The flow may not be able to be increased to accommodate higher heat loads (e.g., to cool hotter components). This can make a heat exchanger relying on natural convection non-dynamic and limited in capacity for thermal dissipation. For a given small space envelope and heat load, it can be difficult to design a natural convection heat exchanger capable of meeting system performance requirements.

It may be desirable to have a system and method that differs from those that are currently available.

BRIEF DESCRIPTION

One example of a thermal management system may include a thermal spreader that can be thermally coupled with a component, a solid state heat pump that can be thermally coupled with the component via the thermal spreader, and a first thermal management assembly that can be thermally coupled with the solid state heat pump. The first thermal management assembly may conduct the thermal energy between the component and an external environment via the solid state heat pump. The thermal management system also may include a second thermal management assembly that can be thermally coupled with the thermal spreader. The second thermal management assembly may conduct the thermal energy between the component and the external environment via the thermal spreader. The first thermal management assembly and the second thermal management assembly may be partially thermally isolated from each other such that a first portion of the thermal energy can be conducted between the component and the external environment via the first thermal management assembly and the solid state heat pump, and a second portion of the thermal energy can be conducted between the component and the external environment via the second thermal management assembly and the thermal spreader. The first portion and the second portion of the thermal energy may be at different temperatures to create convection movement of a working fluid between the second thermal management assembly and the first thermal management assembly.

Another example of a thermal management system may include a solid state heat pump that can be thermally coupled with a component and a first thermal management assembly that can be thermally coupled with the solid state heat pump. The first thermal management assembly may conduct the thermal energy between the component and an external environment via the solid state heat pump. The thermal management system may include a second thermal management assembly that can be thermally coupled with the component. The second thermal management assembly may conduct the thermal energy between the component and the external environment. The first thermal management assembly can conduct a first portion of the thermal energy between the component and the external environment via the solid state heat pump. The second thermal management assembly may conduct a second portion of the thermal energy between the component and the external environment. The first portion and the second portion of the thermal energy can create convection movement of a working fluid between the second thermal management assembly and the first thermal management assembly.

A method for manufacturing, fabricating, or creating one or more of the thermal management systems described herein may include additively manufacturing a three dimensional body. This process may involve printing or otherwise depositing successive layers of material on top of each other to form the shapes of the body or bodies of the thermal management system. Optionally, the body or bodies may be sintered, cured, or otherwise hardened after forming. In another example, the system may be formed by subtractive manufacturing.

BRIEF DESCRIPTION OF THE DRAWINGS

The subject matter may be understood from reading the following description of non-limiting embodiments, with reference to the attached drawings, wherein below.

DETAILED DESCRIPTION

Embodiments of the subject matter described herein relate to thermal management systems and methods that can control temperatures of components in relatively small spaces by cooling or heating the components greater amounts than some known thermal management systems and methods. The systems and methods may use heat pumps to cool or heat components. The heat pump may be a solid state heat pump (e.g., a Peltier heat pump) that, on one side, cools the component and, on another side, heats a first thermal management assembly, such as a first heat sink. The heat injected into the first thermal management assembly may be dissipated from the first heat sink by natural convection. This heat can create a higher natural convection flow rate of the surrounding fluid (e.g., air, another gas, or a liquid). This increased flow rate can help cool a second thermal management assembly, or second heat sink, that also receives or draws heat from the component. This can provide for additional cooling of the component. Alternatively, the system may work in reverse with the heat pump injecting heat into the component to warm the component. The systems and methods may use solid state devices (and may not include or use any moving devices) to cool or heat the components, which can increase the reliability and/or longevity of the systems.

Figure 1:
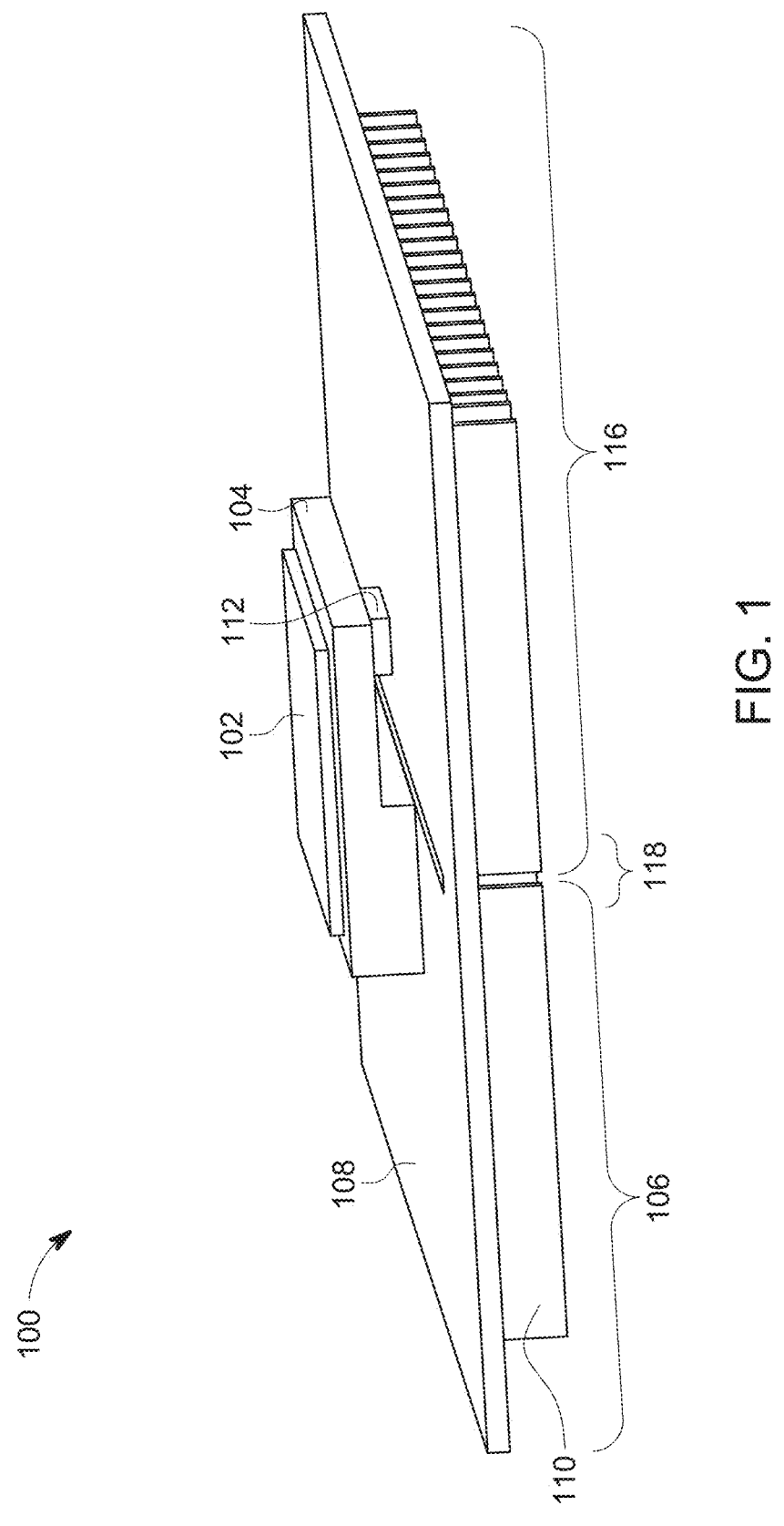
FIG. 1 is a perspective view of one example of a thermal management system.
Figure 2:
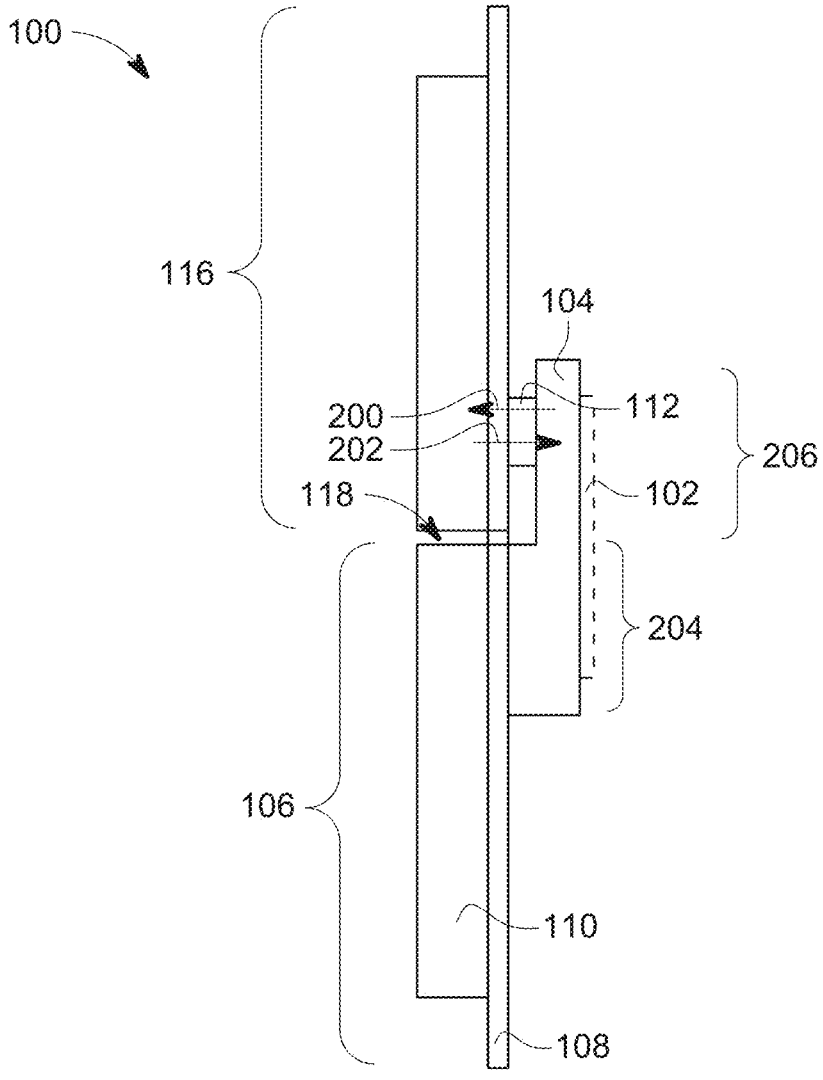
FIG. 2 is a side or plan view of the thermal management system shown in FIG. 1.
Figure 3:
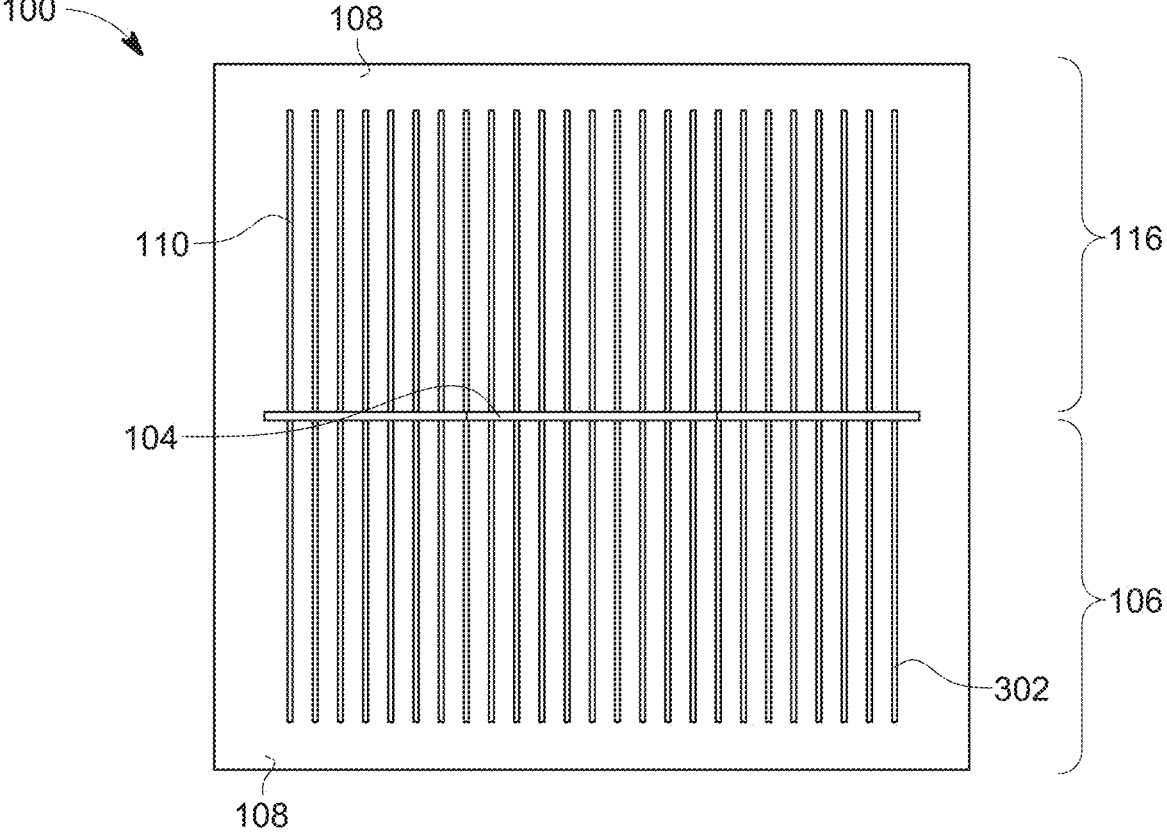
FIG. 3 is a bottom view of the thermal management system shown in FIGS. 1 and 2.

FIG. 1 is a perspective view of one example of a thermal management system 100. FIG. 2 is a side or plan view of the thermal management system shown in FIG. 1. FIG. 3 is a bottom view of the thermal management system shown in FIGS. 1 and 2. The system may be used to change temperatures of (e.g., by cooling and/or heating) one or more components 102. The components may be electronic components, such as processors (e.g., central processing units, microprocessors, integrated circuits, field programmable gate arrays, etc.), graphics processing units (GPUs), voltage regulator modules (VRMs), semiconductor devices (e.g., metal-oxide-semiconductor field-effect transistors, or MOS-FETs), computer memory chips, resistive elements, or the like. Alternatively, the components may be non-electronic components that may require cooling or heating.

The component may be thermally coupled with a thermal spreader body or heat spreader body 104 (also referred to as a thermal spreader). For example, the component may abut or engage the heat spreader, may be connected with the heat spreader by a thermally conductive material, or otherwise be sufficiently close or in contact with the heat spreader such that thermal energy (e.g., heat) can transfer between the component and the heat spreader (e.g., in either direction). The heat spreader can be a single body or multiple bodies or devices that distribute or dissipate heat away from or toward the component. The heat spreader may increase the surface area of the component, thereby allowing for more efficient transfer of thermal energy from or to the component. The heat spreader may be formed from one or more thermally conductive materials, such as copper, aluminum, sealed vapor chambers, or the like. As shown in FIG. 1, the component may abut or directly contact one side of the heat spreader. Optionally, a thermally conductive material (such as a thermally conductive paste or solder) may be disposed between the component and one side of the heat spreader.

While only a single component is shown as being thermally coupled with the spreader, optionally multiple components may be thermally coupled with the thermal spreader. For example, multiple processors and/or other components that are not processors (and that may be the same component or different components) may abut or otherwise be thermally coupled with the thermal spreader.

The heat spreader also may be thermally coupled with a first thermal management assembly 106. For example, a first, thicker portion 204 of the heat spreader (labeled in FIG. 2) may abut or engage one side of the first thermal management assembly, may be connected with the first thermal management assembly by a thermally conductive material, or otherwise be sufficiently close or in contact with the first thermal management assembly such that thermal energy can transfer between the heat spreader and the first thermal management assembly (e.g., in either direction).

The first thermal management assembly can be a single body or multiple bodies or devices that dissipate heat away from or toward the heat spreader. In one example, the first thermal management assembly is a heat sink having a planar or substantially planar base portion 108 with parallel and spaced apart protrusions 110 connected with the base portion (labeled in FIG. 3). The protrusions may extend from the base portion, and may be elongated, planar fins oriented parallel to each other. Alternatively, the first thermal management assembly may have another shape, such as a base that includes elongated pins, honeycomb structures, other polygon or non-polygon shapes, etc. that dissipate the thermal energy to the external environment or that receive the thermal energy from the external environment. The first thermal management assembly may be formed from one or more thermally conductive materials, such as copper, aluminum, sealed vapor chambers, or the like. The side of the first thermal management assembly that is opposite the heat spreader may be open or exposed (e.g., to the ambient environment, to a working fluid, etc.).

The heat spreader also may be thermally coupled with a heat pump 112. The heat pump may include one or more devices that operate to transfer or move thermal energy from one location to another. The heat pump may move the thermal energy in one or more desired directions, such as a cooling direction 200 oriented from the component to a second thermal management assembly 116 (e.g., to cool the component), or a heating direction 202 from the second thermal management assembly to the component (e.g., to cool the component). The second thermal management assembly can include the base portion and protrusions like the first thermal management assembly. In one embodiment, the heat pump does not merely generate thermal energy that emanates from the heat pump in multiple different, opposite directions, but generates the thermal energy in a single direction or in directions that are parallel to each other (but not opposite each other). For example, the heat pump may be or may include a thermoelectric heat pump, such as a Peltier heat pump. This type of heat pump may use the Peltier effect to transfer thermal energy from the component to the second thermal management assembly (or from the second thermal management assembly to the component).

The heat pump can be formed from several semiconductor junctions connected in series with each other, which are connected with a power source, such as one or more battery cells, fuel cells, photovoltaic elements, alternators, generators, etc. Electric energy (e.g., potential or current) is applied to the series of junctions, which causes thermal energy to be transferred from one side of the heat pump to the opposite side of the heat pump. For example, to cool the component, the heat pump may be powered by the power source to move thermal energy from a component side of the heat pump (that faces or engages the component) toward an opposite side of the heat pump (that faces or engages the second thermal management assembly). To heat the component, the heat pump may be powered by the power source to move thermal energy from the opposite side to the component side of the heat pump.

As shown in FIG. 2, the thermal spreader may abut the first thermal management assembly but may be spaced apart from the second thermal management assembly. The thermal spreader may be a single body formed from the same material, but have an L-shape or step shape as shown in the Figures. A first portion 204 of the thermal spreader may be thicker than a second portion 206 of the thermal spreader. The heat pump may be disposed between the thinner second portion of the thermal spreader and the second thermal management assembly.

The first and second thermal management assemblies may be at least partially spaced apart so that thermal energy is not directly passed through the material of one of these thermal management assemblies to the other of these thermal management assemblies. For example, while the base portions of the first and second thermal management assemblies may be continuous or contact each other as shown in FIG. 3, the protrusions extending from the base portions and/or part of the base portions may be separated from each other by an inter-assembly gap 118. This inter-assembly gap may be an air gap between the thermal management assemblies and be formed by a spatial separation between ends of the protrusions and/or a space in the base portions. Optionally, the inter-assembly gap may be completely or entirely filled with a material that is less thermally conductive than the material of the base portions and/or protrusions. For example, the inter-assembly gap may represent a dielectric or insulative material, such as a polymer, ceramic, or the like. Optionally, the inter-assembly gap may also separate all the base portions from each other.

Separation of the protrusions and/or base portions by this inter-assembly gap can thermally isolate the thermal management assemblies from each other. This thermal isolation may allow for natural convection of a working fluid from one thermal management assembly to the other. This can increase the efficiency of cooling or heating the component. For example, to cool the component, the heat pump may be powered to direct thermal energy into the second thermal management assembly. While the thermal spreader may direct some thermal energy from the component into the first thermal management assembly, the additional thermal energy directed into the second thermal management assembly can create a difference in heat between the first and second thermal management assemblies. The heat pump can make the second thermal management assembly hotter than the first thermal management assembly, which can heat the working fluid around and/or between the protrusions of the second thermal management assembly more than the working fluid around and/or between the protrusions of the first thermal management assembly. The working fluid may be ambient air or another fluid, such as a gas, liquid, etc. that transfers thermal energy with the thermal management assemblies.

This heating of the working fluid around the second thermal management assembly can decrease the density of the working fluid between and/or around the protrusions of the second thermal management assembly (relative to the density of the working fluid between and/or around the protrusions of the first thermal management assembly). This difference in density can create a thermal head force or thermal driving head that helps move the working fluid from between and/or around the protrusions of the first thermal management assembly toward areas between and/or around the protrusions of the second thermal management assembly. Movement of the working fluid in this way can help refresh or replenish the working fluid between and/or around the protrusions of the first thermal management assembly with working fluid from outside of or away from the thermal management assemblies. This can help cool the first thermal management assembly faster than if the heat pump, second thermal management assembly, and/or heat spreader were not arranged or operating in the manner described above. As a result, the component may be cooled faster and/or using a smaller volume of space for the components of the system relative to other thermal management systems.

As another example, to heat the component, the heat pump may be powered to direct thermal energy into the component via the thermal spreader. For example, the heat pump may generate heat on the side of the heat pump that faces the thermal spreader and the component. The heat pump also may cool the second thermal management assembly (as the side of the heat pump that is opposite the component and thermal spreader is cooled more than the side of the heat pump that faces the component and the thermal spreader). This can result in cooling of the working fluid between and/or around the protrusions of the second thermal management assembly. The cooling of this working fluid can increase the density of the working fluid around the second thermal management assembly relative to the working fluid around the first thermal management assembly. This difference in density can create a thermal head force or thermal driving head that helps move the working fluid from between and/or around the protrusions of the second thermal management assembly toward areas between and/or around the protrusions of the first thermal management assembly. Movement of the working fluid in this way can help refresh or replenish the working fluid between and/or around the protrusions of the second thermal management assembly with working fluid from outside of or away from the thermal management assemblies. This can help cool the second thermal management assembly faster than if the heat pump, first thermal management assembly, and/or heat spreader were not arranged or operating in the manner described above. As a result, the component may be heated faster and/or using a smaller volume of space for the components of the system relative to other thermal management systems.

Figure 4:
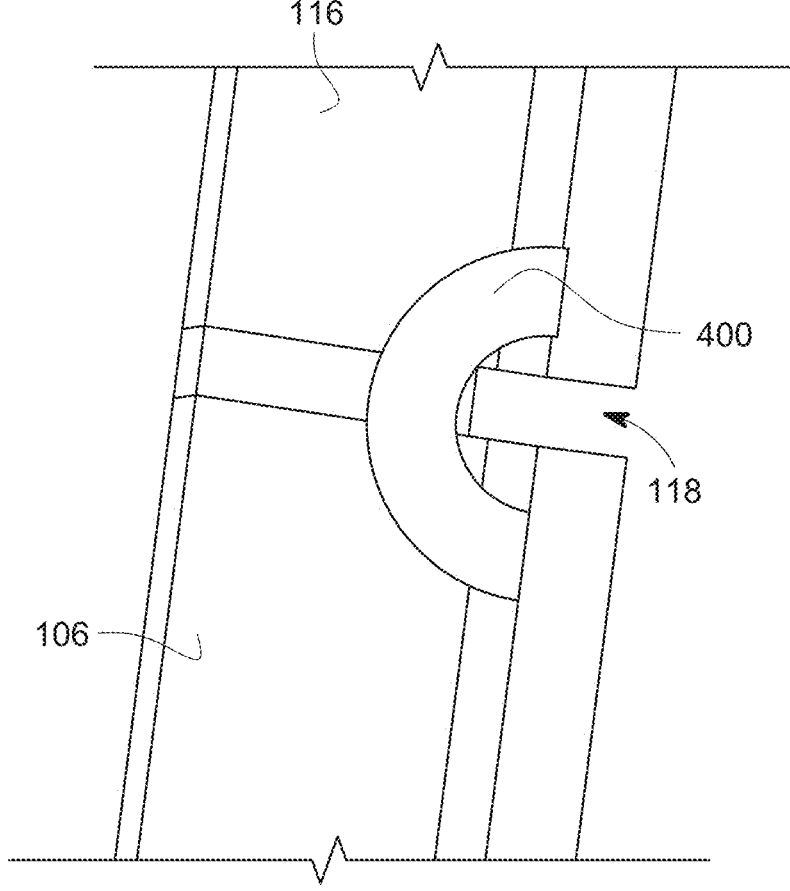
FIG. 4 illustrates one example of a stiffening bridge between the thermal management assemblies shown in FIGS. 1 through 3.

FIG. 4 illustrates one example of a stiffening bridge 400 between the thermal management assemblies shown in FIGS. 1 through 3. The inter-assembly gap between the thermal management assemblies may create a weak point or line that can allow for the thermal management assemblies to bend or move relative to each other along this weak point or line. To prevent this, one or more of the stiffening bridges may be formed from one thermal management assembly to the other thermal management assembly, and across the inter-assembly gap. The stiffening bridge may connect the first thermal management assembly and the second thermal management assembly across the inter-assembly gap by extending the material of the thermal management assemblies across the gap, or by adding material to form the bridge across the inter-assembly gap. The bridge may be formed from material(s) that differ from the material(s) used to form the thermal management assemblies. For example, the bridge may be formed to be less thermally conductive than the thermal management assemblies to prevent thermal energy from being transferred between the thermal management assemblies through or via the bridge. The bridge can strengthen the connection between the thermal management assemblies to prevent bending or breaking of the system at or along the inter-assembly gap without increasing the thermal conductivity between the thermal management assemblies.

Figure 5:
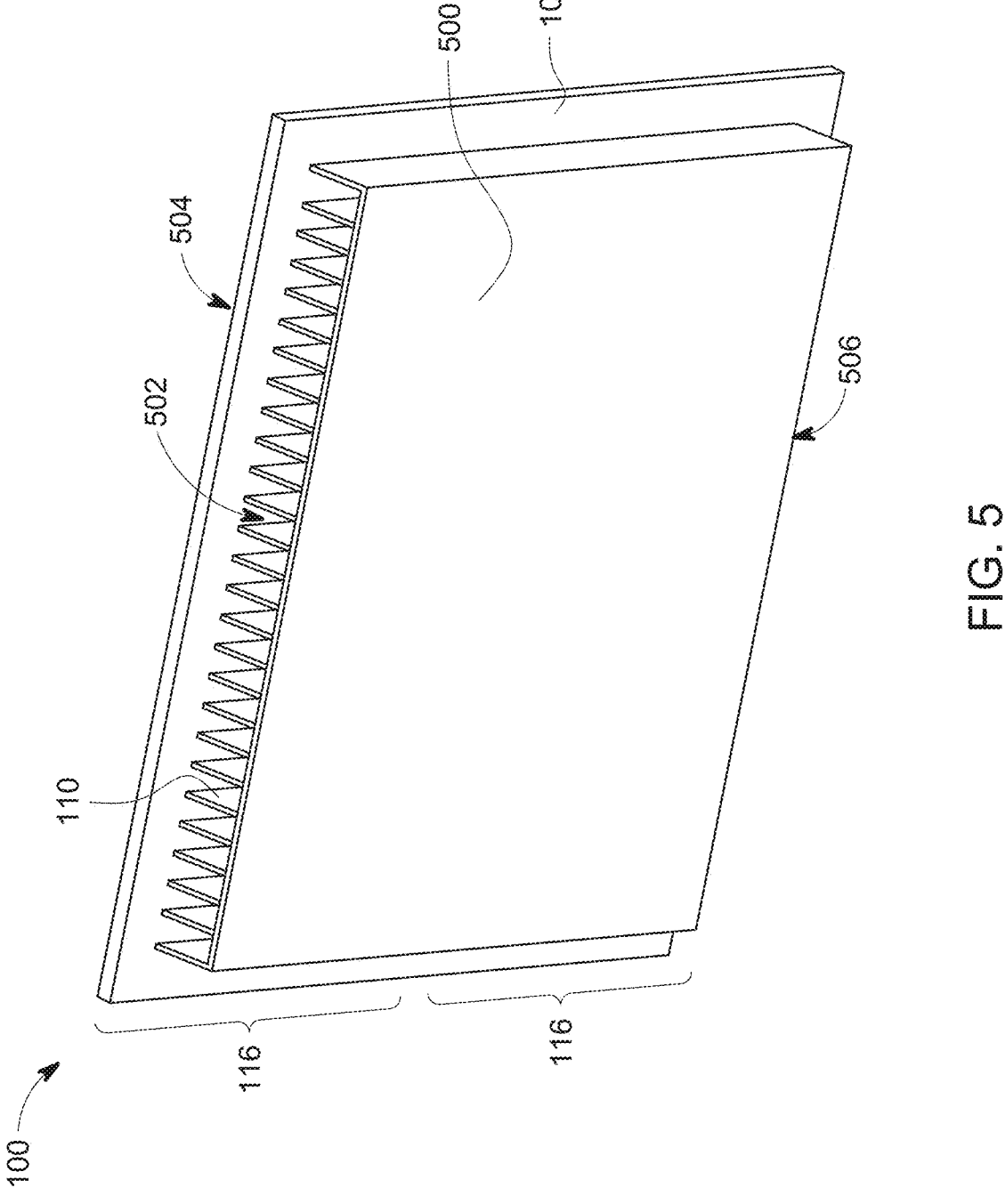
FIG. 5 illustrates a perspective view of the thermal management system shown in FIG. 1 with a cover on the first and second thermal management assemblies also shown in FIG. 1.

FIG. 5 illustrates a perspective view of the thermal management system shown in FIG. 1 with a cover 500 on the first and second thermal management assemblies also shown in FIG. 1. The thermal management system may include the cover on outer ends of the protrusions extending away from the base portions of the thermal management assemblies. This cover can be a plate or other structure that partially encloses the protrusions. In the illustrated example, the addition of the cover forms conduits 502 that are bounded or framed by the base portions, the protrusions, and the cover. These conduits may be open at opposite ends 504, 506 of the system, but otherwise closed. For example, each of the first and second thermal management assemblies may include several conduits oriented parallel to each other with each conduit in the first thermal management assembly being coaxial or linearly aligned with a conduit in the second thermal management assembly. Depending on whether the system is used to cool or heat the component, the ends 504, 506 can represent inlets and outlets of the working fluid through the conduits. For example, during cooling of the component, the working fluid may flow into the conduits through the end 506 and exit the conduits out of the end 504. During heating of the component, the working fluid may flow into the conduits through the end 504 and exit the conduits out of the end 506.

Formation of the conduits can provide passageways for the flow of the working fluid between the protrusions of the thermal management assemblies. The conduits can speed up flow of the working fluid as the working fluid is constrained to move within the conduits instead of being free to flow in many more directions. For example, the conduits may form chimneys that limit the degrees of freedom that the working fluid may flow between the protrusions to moving through the conduits in opposite directions. During cooling of the component, the conduits can speed up flow of the working fluid from the conduits of the second thermal management assembly into and through the conduits of the first thermal management assembly. During heating of the component, the conduits can speed up flow of the working fluid from the conduits of the first thermal management assembly into and through the conduits of the second thermal management assembly. The conduits can speed up flow of the working fluid and thereby speed up the cooling or heating of the component.

Figure 6:
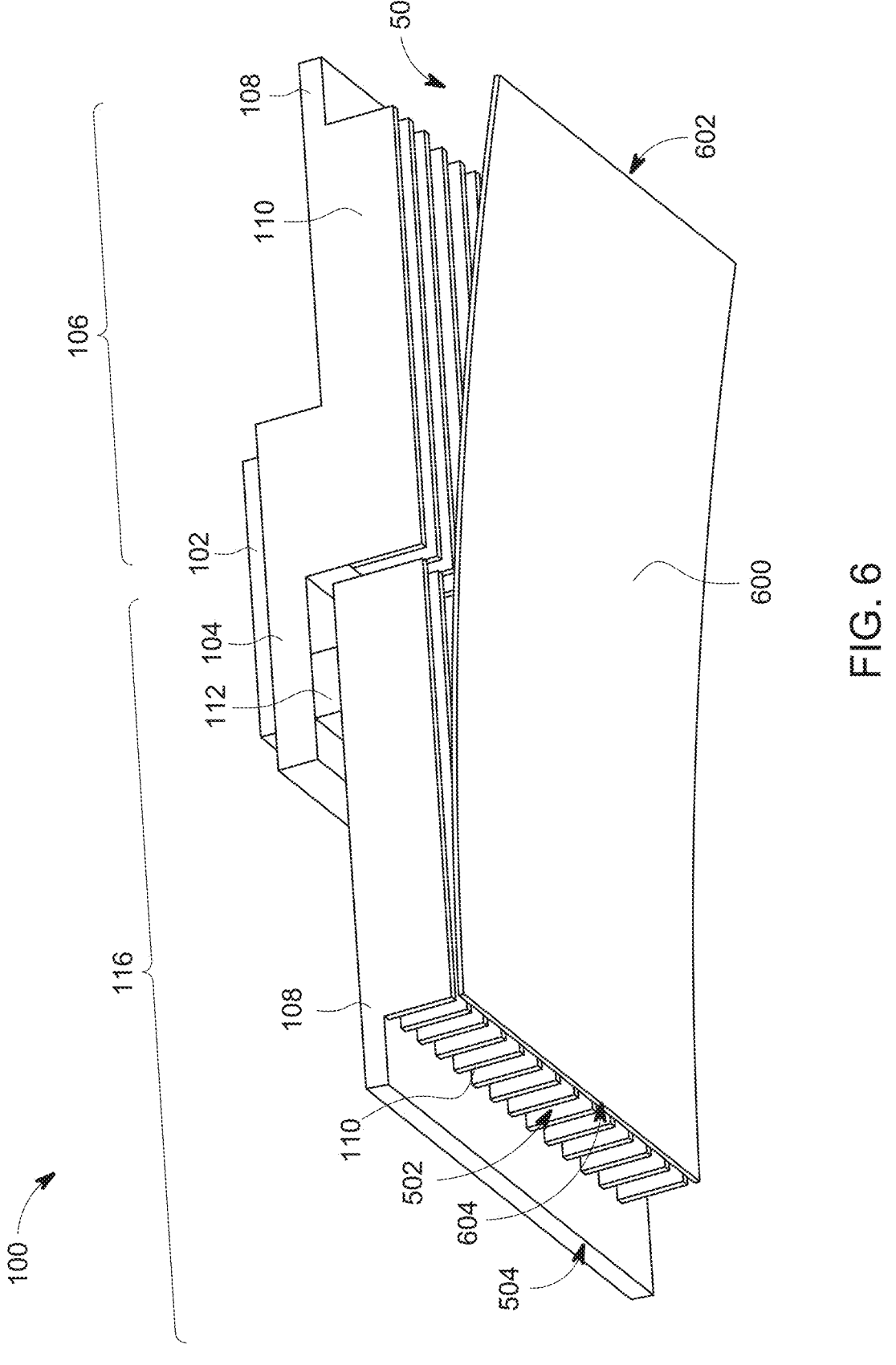
FIG. 6 illustrates a perspective view of the thermal management system shown in FIG. 1 with an angled cover on the first and second thermal management assemblies also shown in FIG. 1.

FIG. 6 illustrates a perspective view of the thermal management system shown in FIG. 1 with an angled cover 600 on the first and second thermal management assemblies also shown in FIG. 1. In contrast to the cover shown in FIG. 5 that is equidistant from the base portions of both thermal management assemblies, the cover shown in FIG. 6 is angled and/or curved such that one end 602 of the cover is farther from the base portion and the outer ends of the protrusions than another end 604 of the cover. For example, the farther end 602 of the cover may be spaced apart or separated from the protrusions of the first thermal management assembly than the closer end 604 of the cover (which may abut or not be spaced apart from the protrusions of the second thermal management assembly closer to the end 504 of the system).

This cover may allow more of the working fluid to enter volumes between the protrusions of the first and/or second thermal management assemblies than the cover shown in FIG. 5. The conduits formed by the cover near the closer end can provide passageways for the flow of the working fluid between the protrusions of the thermal management assemblies. The conduits can speed up flow of the working fluid as the working fluid is constrained to move within the conduits instead of being free to flow in many more directions.

Figure 7:
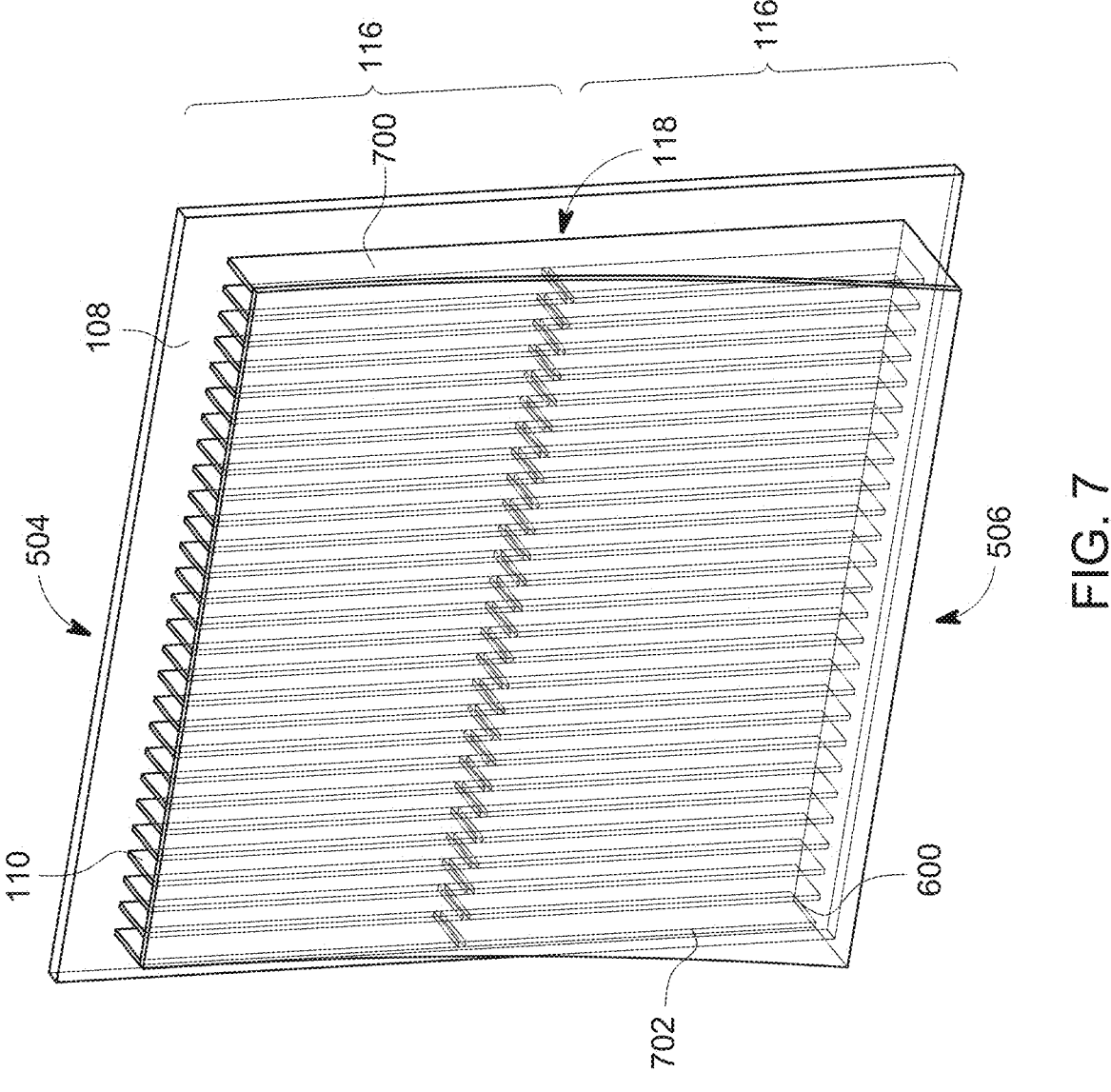
FIG. 7 illustrates a perspective view of the thermal management system shown in FIG. 1 with the angled cover shown in FIG. 6 and sidewalls.

FIG. 7 illustrates a perspective view of the thermal management system shown in FIG. 1 with the angled cover 600 shown in FIG. 6 and sidewalls 700, 702. In contrast to the cover shown in FIG. 6, the cover shown in FIG. 7 may be coupled with the base portions of the thermal management assemblies by the sidewalls. The sidewalls may further enclose the sides of the conduits to form tapered conduits or chimneys that are larger closer to the end 506 of the system than the opposite end 504 of the system. The conduits may remain open at the opposite ends 504, 506 of the system. The conduits with the sidewalls can speed up flow of the working fluid as the working fluid is constrained to move within the conduits instead of being free to flow in many more directions, while the curved or angled cover allows more of the working fluid to enter into the conduits (when compared with the flat cover shown in FIG. 5).

Figure 8:
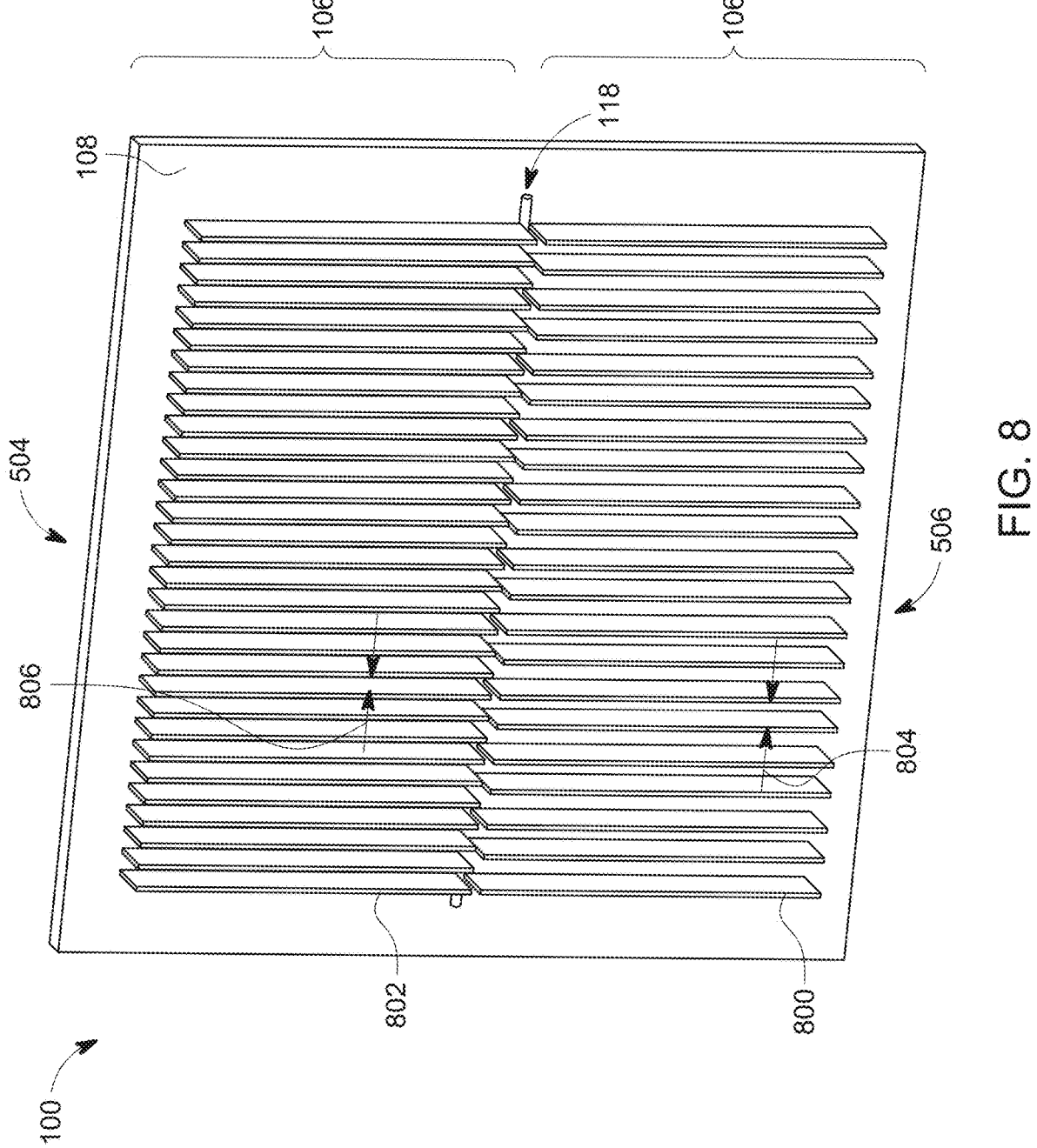
FIG. 8 illustrates a perspective view of the thermal management system shown in FIG. 1 with differently spaced protrusions of the thermal management assemblies.

FIG. 8 illustrates a perspective view of the thermal management system shown in FIG. 1 with differently spaced protrusions 800, 802 of the thermal management assemblies 106, 116. In the example shown in FIG. 1, the protrusions 110 of the thermal management assemblies are parallel to each other and are equidistant from each other in both of the thermal management assemblies (e.g., within manufacturing tolerances). In the example of FIG. 8, the protrusions 800 of the thermal management assembly 106 are parallel but spaced farther from each other than the protrusions 802 of the thermal management assembly 116. For example, a closest distance 804 between neighboring or adjacent protrusions in the first thermal management assembly may be larger or longer than a closest distance 806 between neighboring or adjacent protrusions in the second thermal management assembly.

The smaller separation distance for the protrusions of the first thermal management assembly can result in the first thermal management assembly having more protrusions than the second thermal management assembly. The greater spacing between the protrusions in the second thermal management assembly may allow more of the working fluid to enter volumes between the protrusions than if the protrusions were equally spaced apart in both thermal management assemblies. The closer protrusions in the first thermal management assembly can cause the working fluid with the lower density to flow faster between these protrusions than the farther spaced apart protrusions in the second thermal management assembly.

Figure 9:
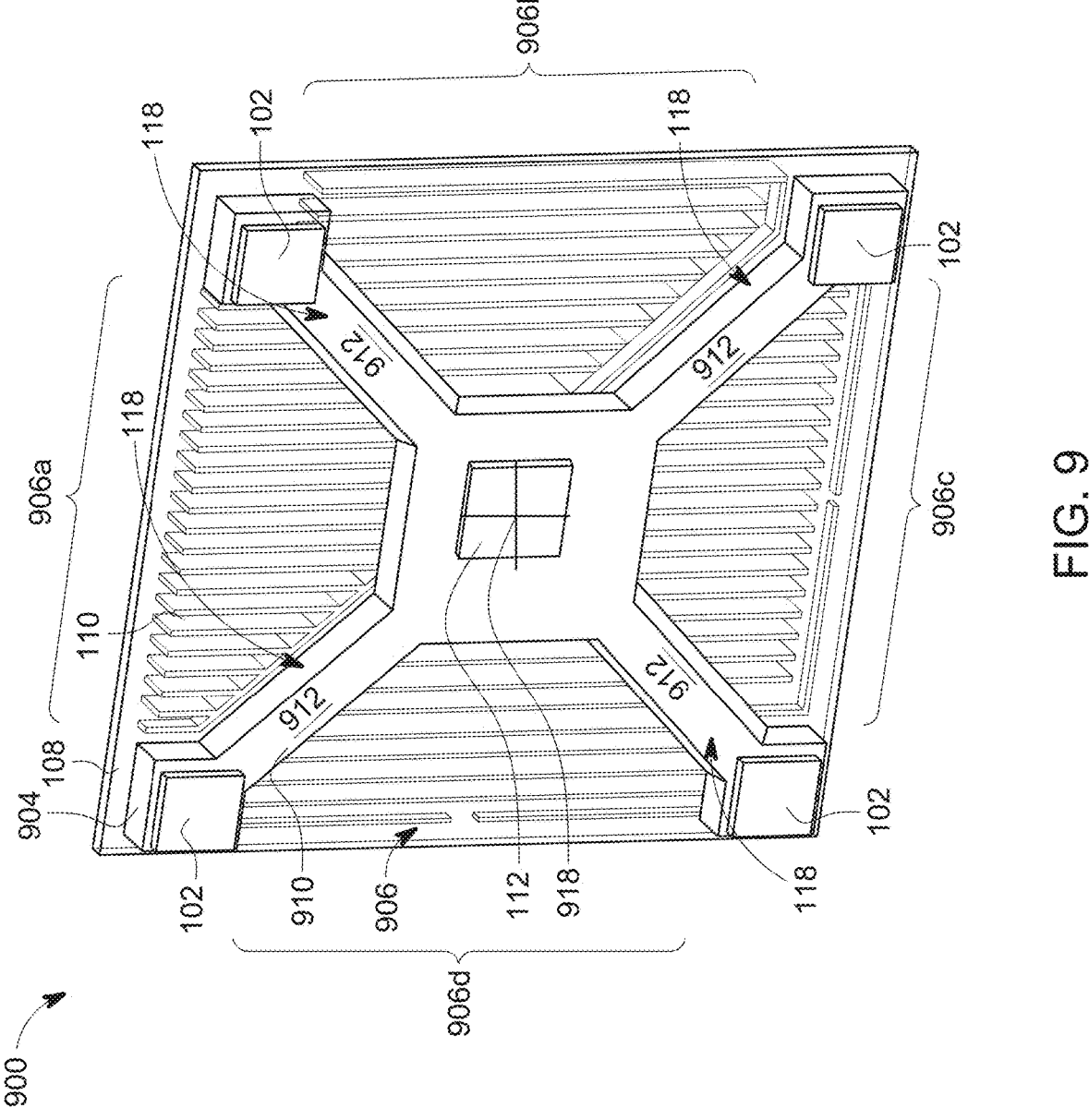
FIG. 9 illustrates a phantom or partially transparent view of another of a thermal management system.
Figure 10:
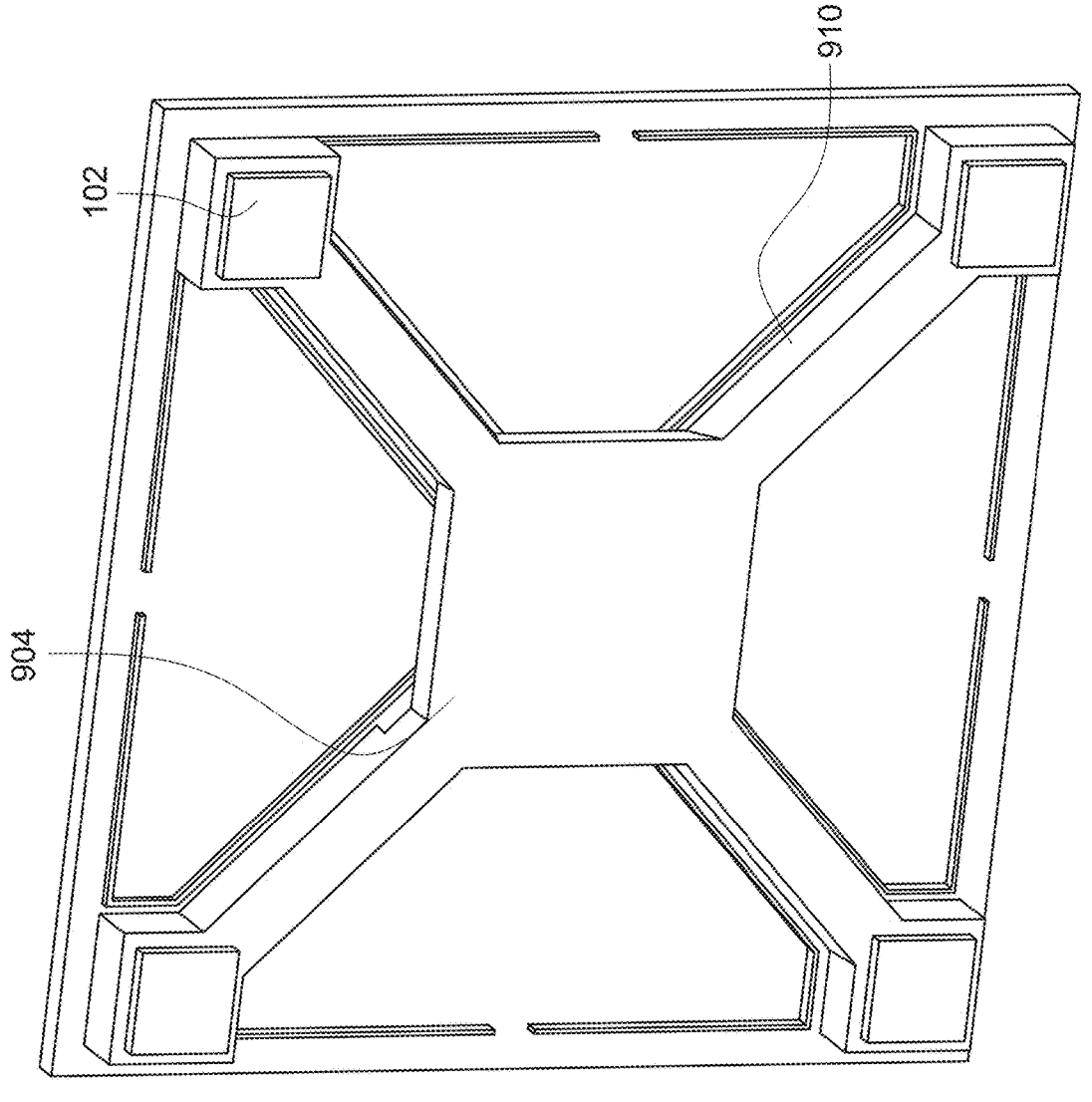
FIG. 10 illustrates another view of the thermal management system shown in FIG. 9.
Figure 11:
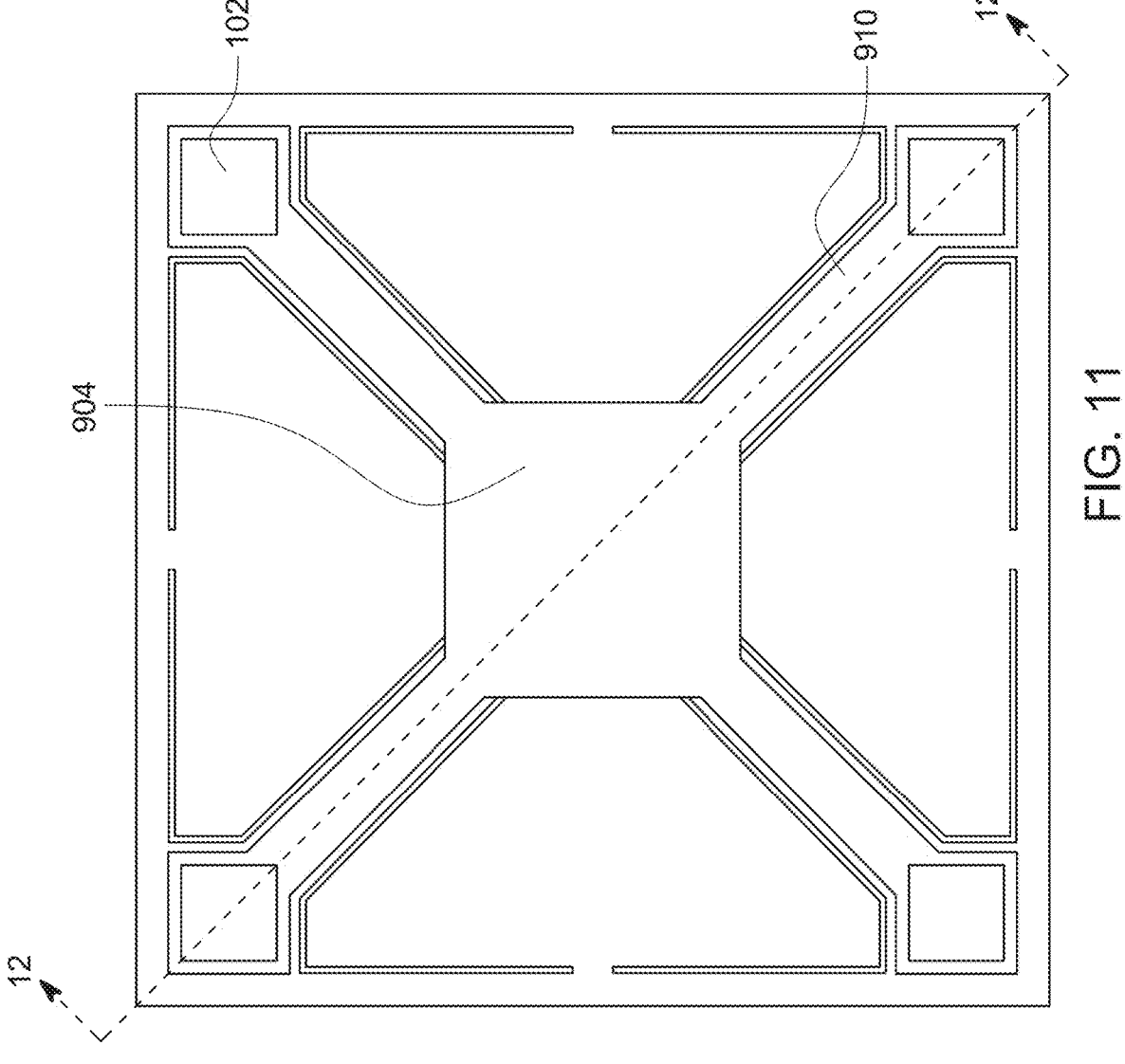
FIG. 11 illustrates a plan view of the thermal management system shown in FIGS. 9 and 10.
Figure 12:
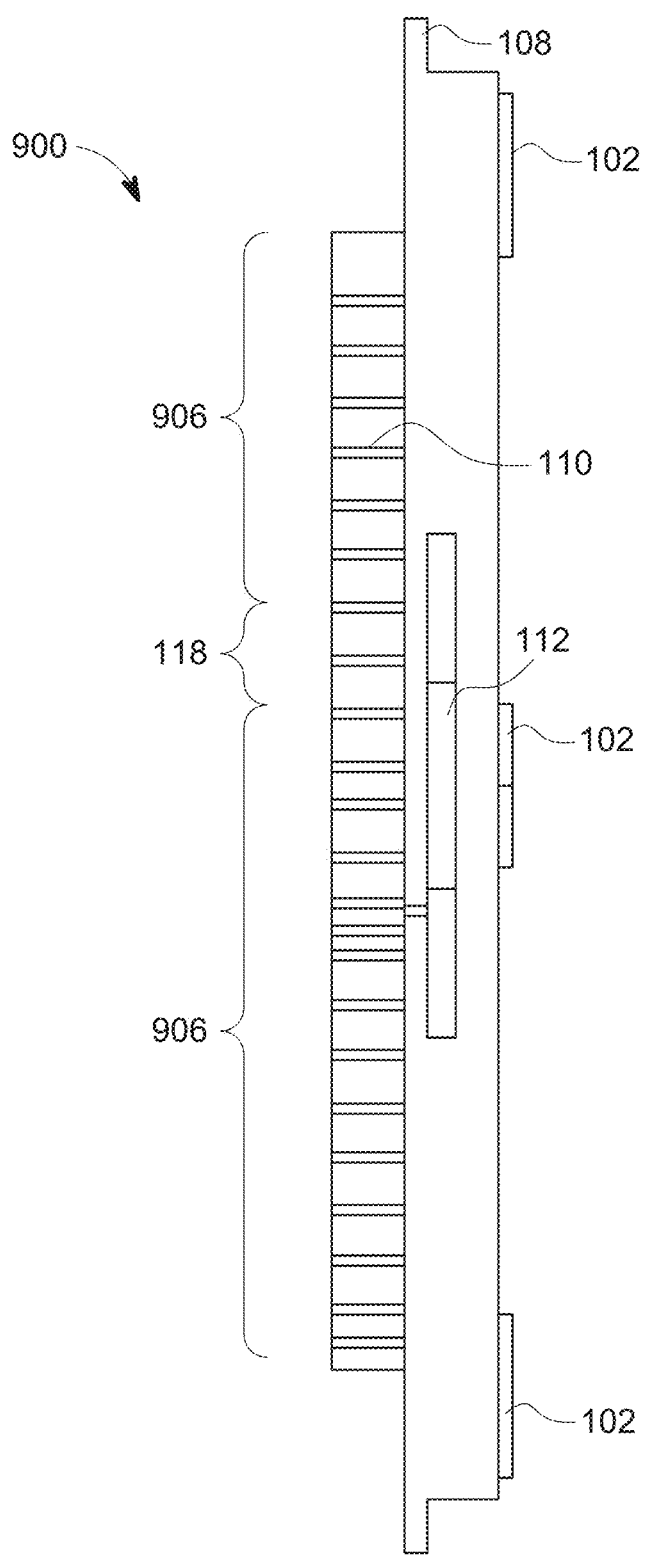
FIG. 12 illustrates a cross-sectional view of the thermal management system show in FIGS. 9 through 11 along line 12-12 shown in FIG. 11.
Figure 13:
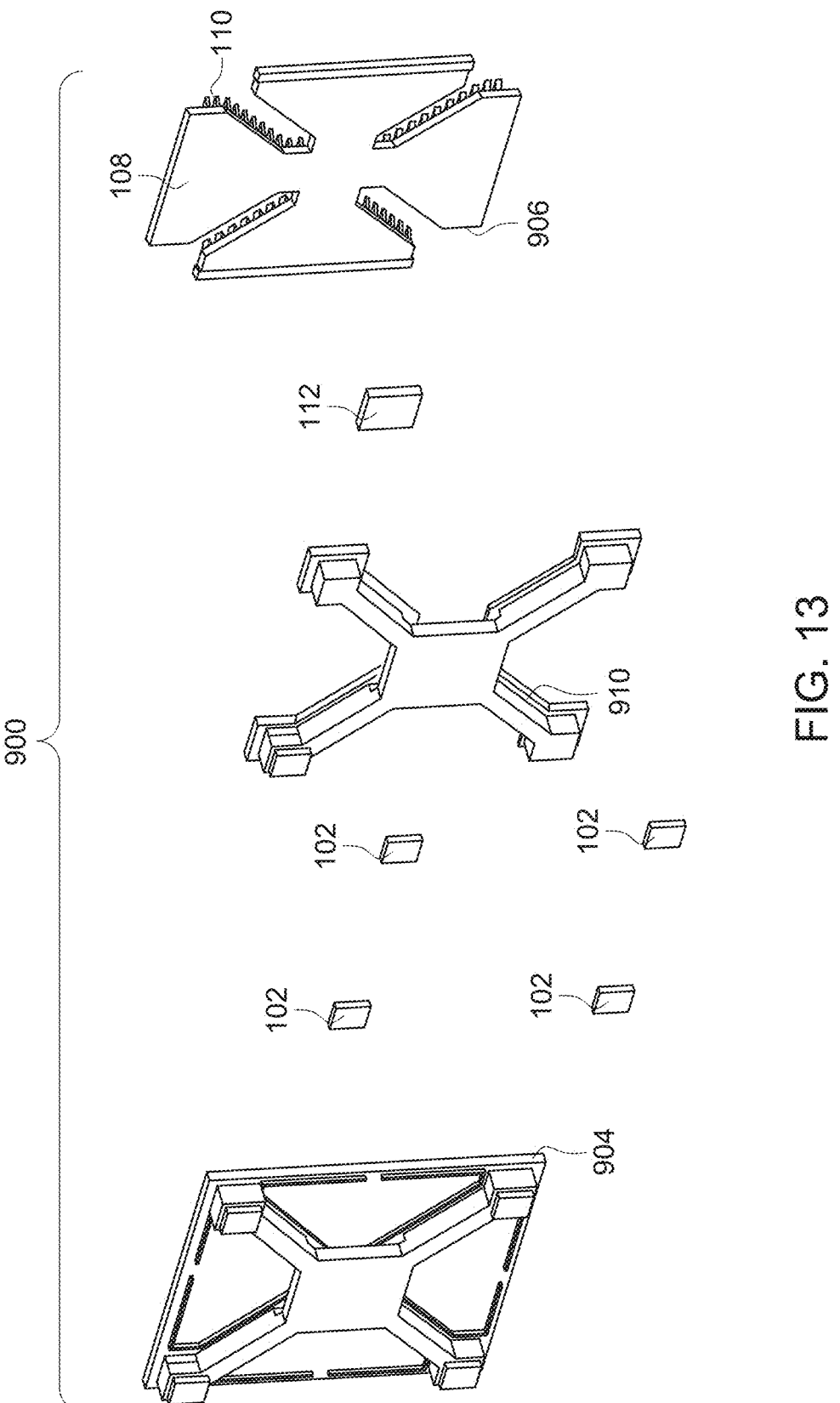
FIG. 13 illustrates an exploded view of the thermal management system shown in FIGS. 9 through 12.
Figure 14:
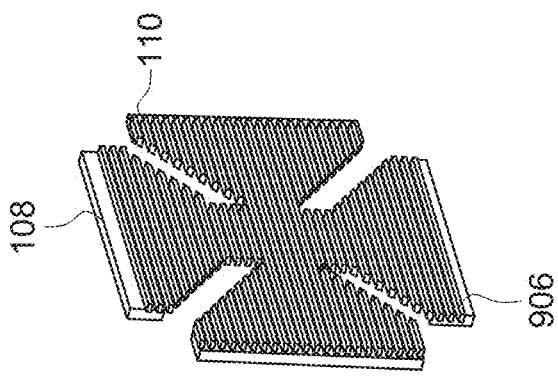
FIG. 14 illustrates another exploded view of the thermal management system shown in FIGS. 9 through 13.
Figure 14:
Figure 14:
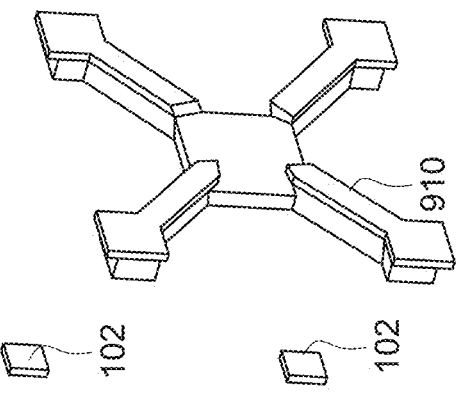
Figure 14:
Figure 14:
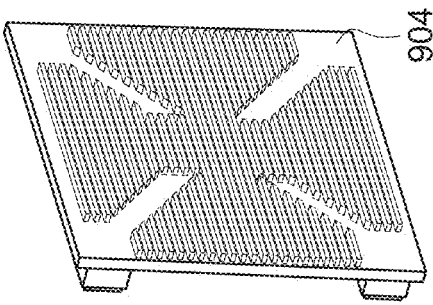

FIG. 9 illustrates a phantom or partially transparent view of another of a thermal management system 900. FIG. 10 illustrates another view of the thermal management system shown in FIG. 9. FIG. 11 illustrates a plan view of the thermal management system shown in FIGS. 9 and 10. FIG. 12 illustrates a cross-sectional view of the thermal management system show in FIGS. 9 through 11 along line 12-12 shown in FIG. 11. FIG. 13 illustrates an exploded view of the thermal management system shown in FIGS. 9 through 12. FIG. 14 illustrates another exploded view of the thermal management system shown in FIGS. 9 through 13. The thermal management system shown in FIGS. 9 through 14 may operate as the system shown in FIGS. 1 through 8 to cool or heat the component using the heat pump and a thermal management assembly 906.

The thermal management assembly may include a common or the same base portion with different or separate groups of the protrusions extending or protruding away from the base portion toward a thermal spreader body 904. Each of these groups may be in the shape of a triangle such that some protrusions in each group are longer than other protrusions in that group. Optionally, the protrusions may be arranged in another shape. In contrast to other embodiments, the protrusions of the thermal management assemblies may protrude toward, instead of away from, the thermal spreader body. As shown in FIG. 14, the thermal spreader body optionally may include the protrusions and, therefore, be referred to as another thermal management assembly.

The groups of protrusions may be spaced apart by inter-assembly gaps in directions that are parallel to the base portion of the thermal management assemblies and between opposing ends of the protrusions. As shown, these gaps may fan out from a center 918 of the thermal management assemblies such that first ends of the gaps are closer together near the center and opposite second ends of the gaps are farther apart from each other (e.g., farther from the center).

The thermal spreader body may have protruding walls 910 that form several thermal tunnels, conduits, or channels 912. These protruding walls may extend from the thermal spreader body in directions away from the thermal management assemblies. In the illustrated embodiment, the thermal tunnels oppose and extend along the gaps between the thermal management assemblies. For example, each of the thermal tunnels may be oriented and elongated in a direction that is parallel to one of the gaps between the thermal management assemblies. The tunnels may define pathways through which thermal energy may pass between (a) the thermal management assemblies and (b) the thermal spreader body, as described herein.

The heat pump may be located between (a) the thermal spreader body and (b) the thermal management assemblies at or near the center of the thermal management assemblies and the center of the thermal spreader body. For example, the heat pump may be located at an intersection between the thermal tunnels and/or an intersection between the gaps, as shown in FIG. 9. Opposite sides of the heat pump may abut or engage the thermal management assemblies and the thermal spreader body. One side of the heat pump can directly contact the thermal management assemblies and the opposite side of the heat pump can directly contact the thermal spreader body. Optionally, the sides of the heat pump may indirectly contact the thermal management assemblies and/or thermal spreader body via another body.

Several of the components may be connected with the thermal spreader body spaced apart from the heat pump. As shown in FIGS. 9 through 14, the components may be disposed at ends of the thermal tunnels that are opposite ends of the thermal tunnels that are at or closer to the thermal spreader body. While four components are shown, alternatively, the system may have fewer (or one) components, or more than four components.

The thermal tunnels may have a fluid in the tunnels, such as a working fluid (e.g., air, a coolant, etc.), that transfers thermal energy between the components and the heat pump. To cool the components, the heat pump may be powered to direct thermal energy into the thermal management assemblies. While the thermal spreader may direct some thermal energy from the components into the thermal management assemblies, the additional thermal energy directed into the thermal management assemblies by the heat pump can create a difference in heat between the thermal management assemblies. Additional heat or thermal energy may flow through the thermal tunnels from the components toward or to the heat pump.

This heating of the working fluid around the thermal management assemblies via the thermal tunnels and/or the heat pump can decrease the density of the working fluid between and/or around the protrusions of the thermal management assemblies (relative to the density of the working fluid between the protrusions of the thermal management assemblies). This difference in density can create a thermal head force or thermal driving head that helps move the working fluid from between and/or around the protrusions of the thermal management assemblies toward the thermal tunnels. Movement of the working fluid in this way can help refresh or replenish the working fluid between and/or around the protrusions of the thermal management assemblies with working fluid from outside of or away from the thermal management assemblies. This can help cool the thermal management assemblies faster than if the heat pump and/or heat spreader were not arranged or operating in the manner described above. As a result, the components may be cooled faster and/or using a smaller volume of space for the components of the system relative to other thermal management systems.

As another example, to heat the components, the heat pump may be powered to direct thermal energy into the components via the thermal spreader and/or the thermal tunnels. For example, the heat pump may generate heat on the side of the heat pump that faces the thermal spreader. The heat pump also may cool the thermal management assemblies. This can result in cooling of the working fluid between and/or around the protrusions of the second thermal management assembly. The cooling of this working fluid can increase the density of the working fluid around the thermal management assemblies relative to the working fluid outside of the thermal management assemblies. This difference in density can create a thermal head force or thermal driving head that helps move the working fluid from between and/or around the protrusions of the thermal management assemblies toward other areas. Movement of the working fluid in this way can help refresh or replenish the working fluid between and/or around the protrusions of the thermal management assemblies with working fluid from outside of or away from the thermal management assemblies. This can help cool the thermal management assemblies faster than if the heat pump and/or heat spreader were not arranged or operating in the manner described above. As a result, the components may be heated faster and/or using a smaller volume of space for the components of the system relative to other thermal management systems.

Figure 15:
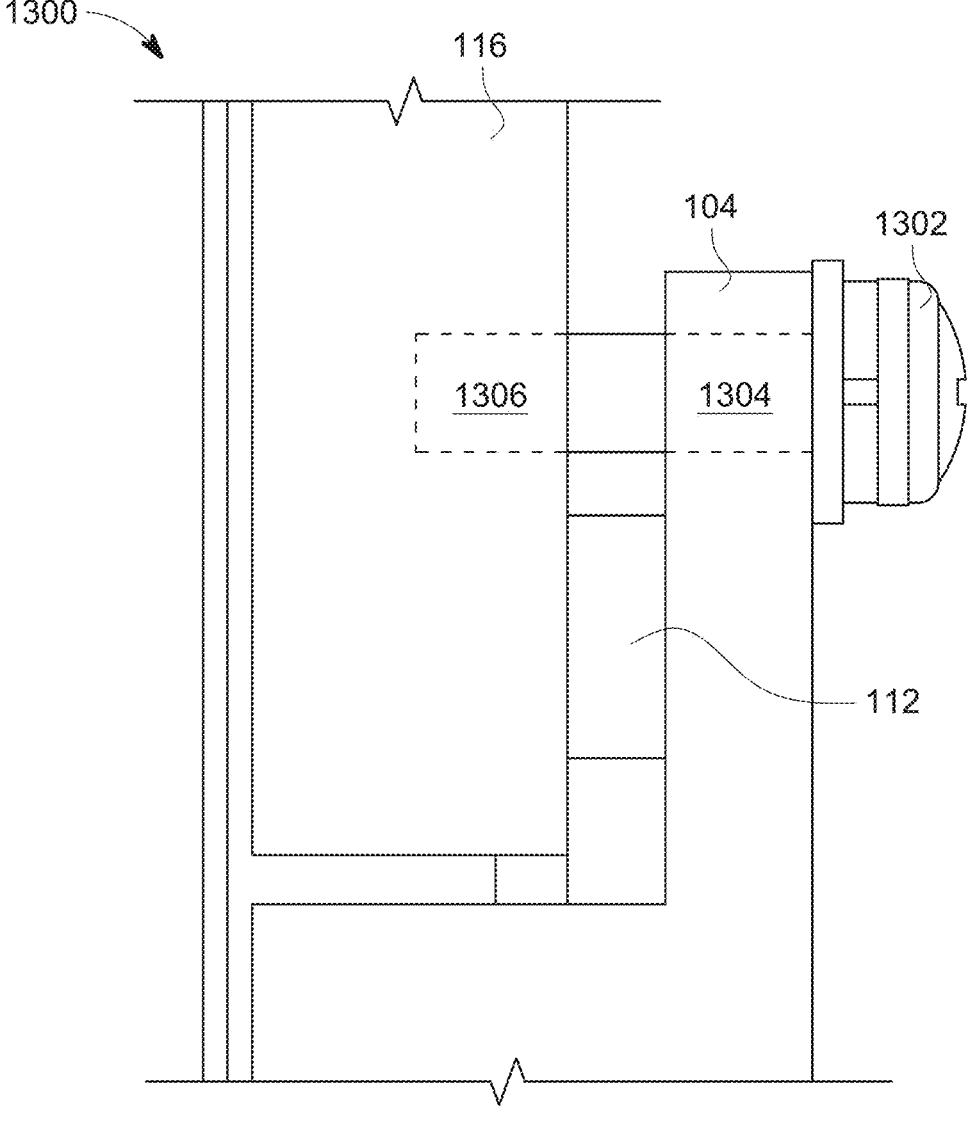
FIG. 15 illustrates another example of a thermal management system.

FIG. 15 illustrates another example of a thermal management system 1300. The system shown in FIG. 15 may be similar to the system shown in FIGS. 1 through 3, with the addition of a fastener 1302. As shown in FIGS. 1, 2, and 15, the thinner portion of the thermal spreader body may be a cantilevered beam. In the example shown in FIG. 15, the thinner portion may have a through hole or channel 1304 that the fastener can extend through. The second thermal management assembly may have a receptacle 1306 in which one end of the fastener can be received. This receptacle may have an internal threaded surface that corresponding threads on the outside of the fastener can mate with to secure the fastener in the receptacle.

The thinner portion of the thermal spreader can be manufactured (e.g., additively printed or manufactured) to bend or be angled away from the second thermal management assembly to provide clearance for insertion of the heat pump. Optionally, the thinner portion of the thermal spreader can be manufactured to be farther away from the second thermal management assembly than the thickness of the heat pump. In either situation, the space between the surface of the thinner portion of the thermal spreader that faces the second thermal management assembly and the surface of the base of the second thermal management assembly that faces the thermal spreader may be larger than the thickness of the heat pump (between the opposite surfaces or sides of the heat pump). This can assist in placing the heat pump between the thermal spreader and the second thermal management assembly (e.g., relative to a smaller clearance or space between the thermal spreader and the second thermal management assembly).

The fastener can then be placed through the hole in the thermal spreader and into the receptacle in the second thermal management assembly. The fastener can be tightened to move the end of the thinner portion of the thermal spreader toward the second thermal management assembly. For example, as the threaded fastener is screwed deeper into the receptacle, the head of the fastener can push down the cantilevered beam of the thermal spreader toward the second thermal management assembly. This can ensure that both sides of the heat pump abut or directly engage the thermal spreader and the second thermal management assembly.

Figure 16:
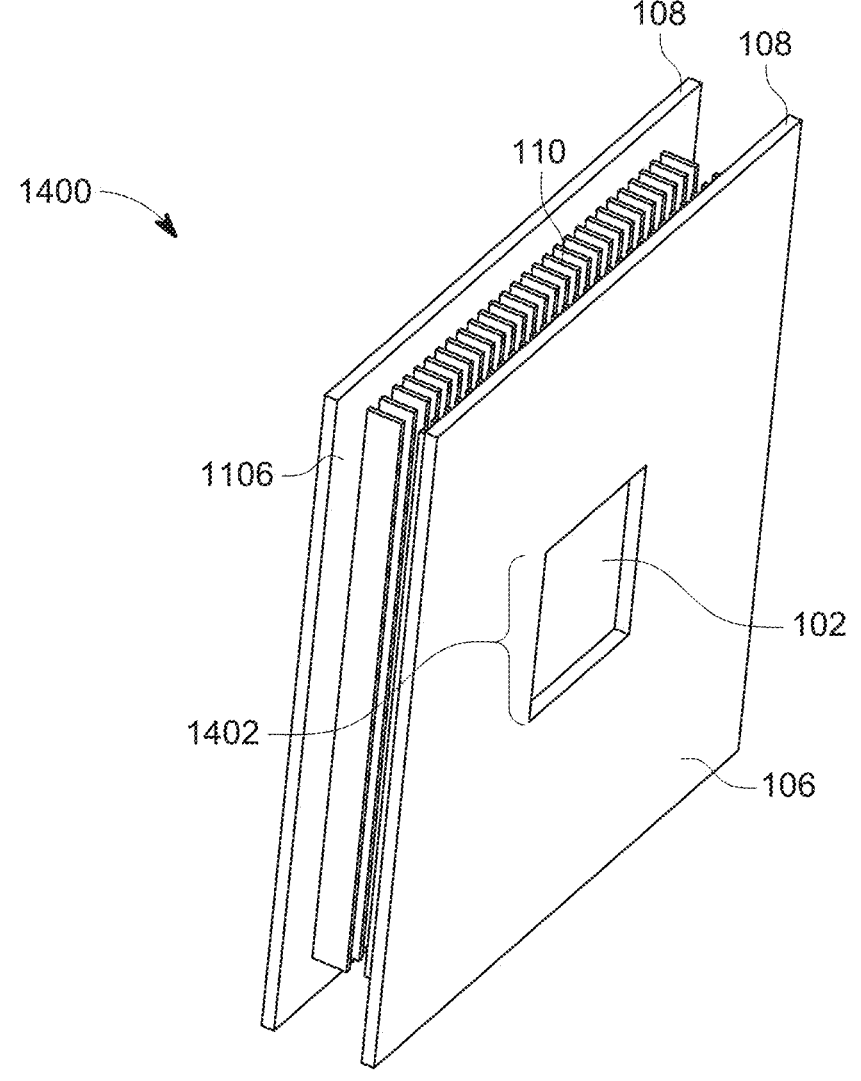
FIG. 16 illustrates a perspective view of another example of a thermal management system.
Figure 17:
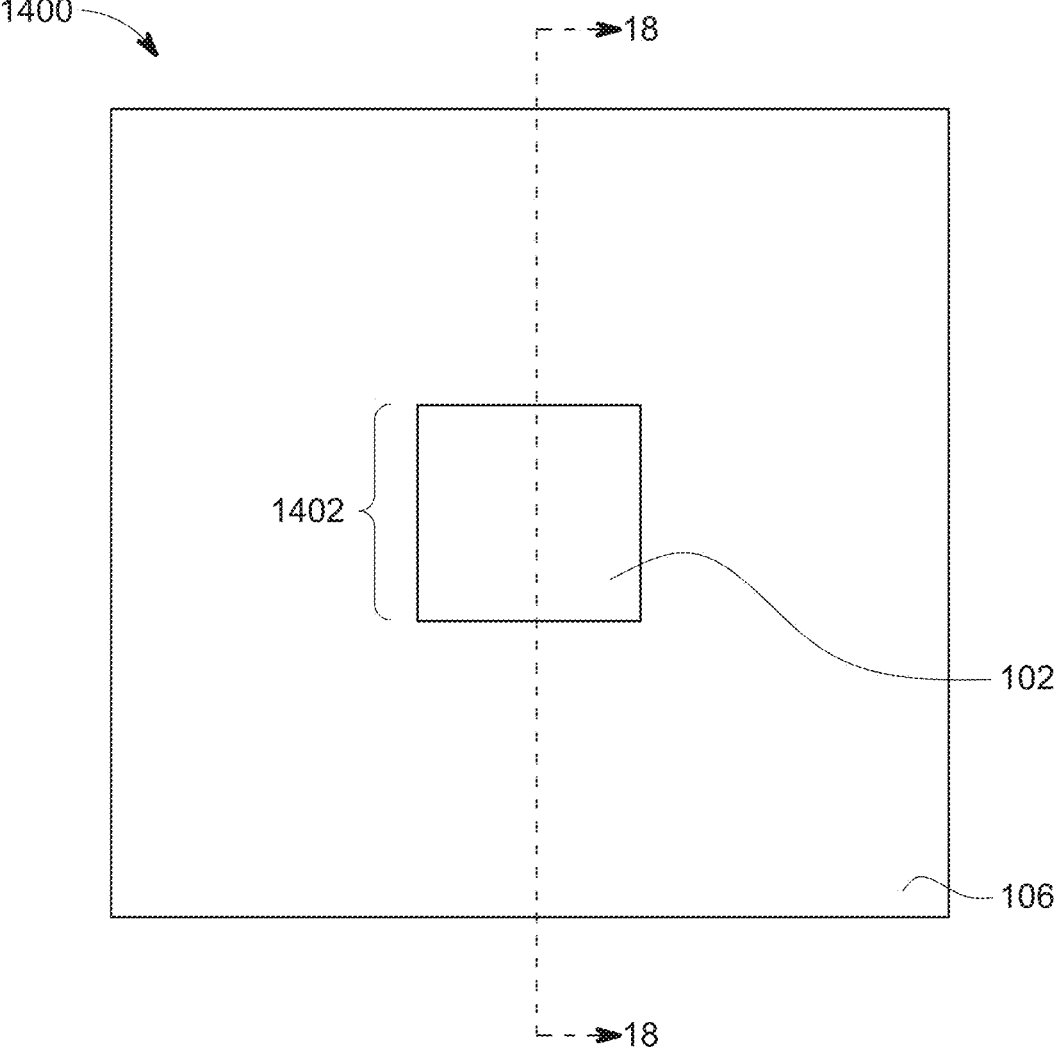
FIG. 17 illustrates a plan view of the thermal management system shown in FIG. 16.
Figure 18:
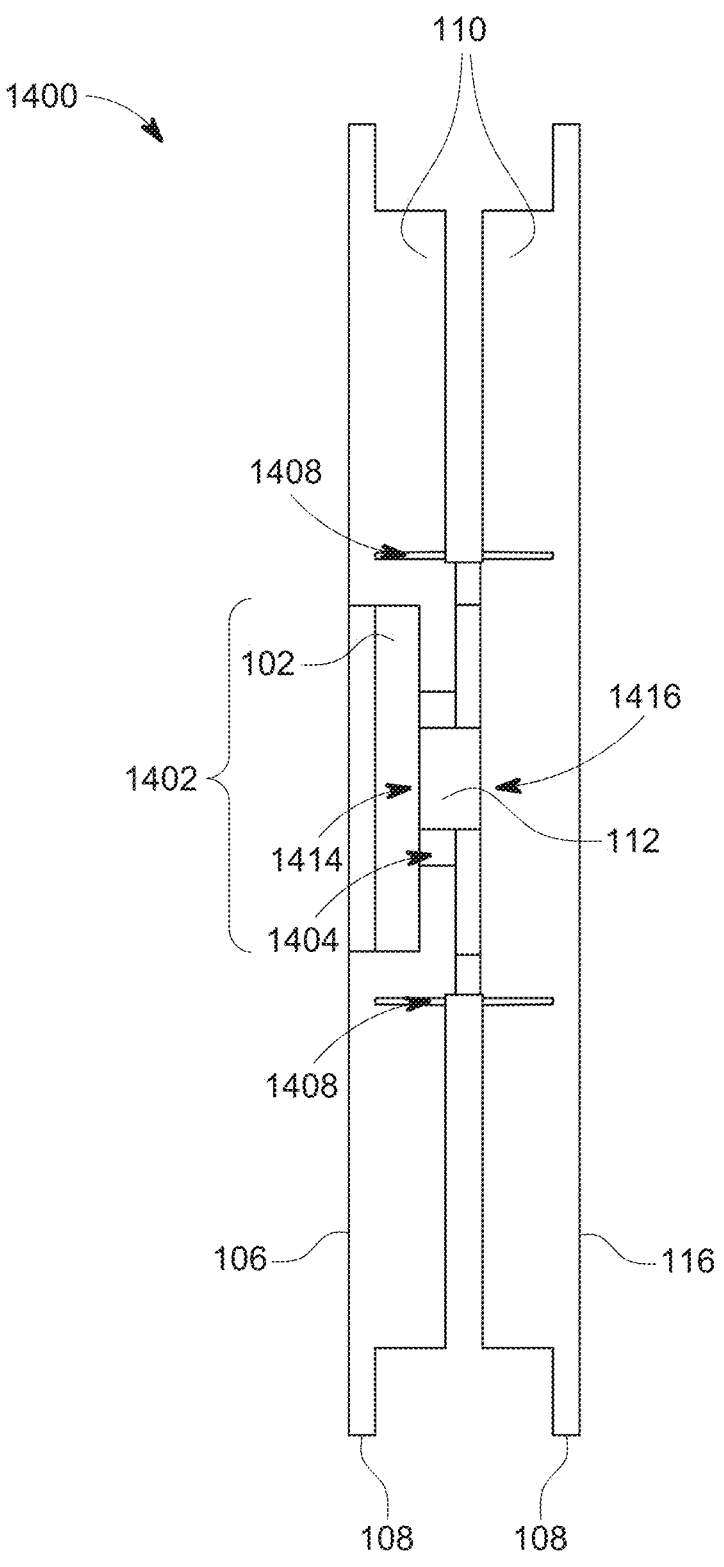
FIG. 18 illustrates a cross-sectional view of the thermal management system along line A-A shown in FIG. 17.
Figure 19:
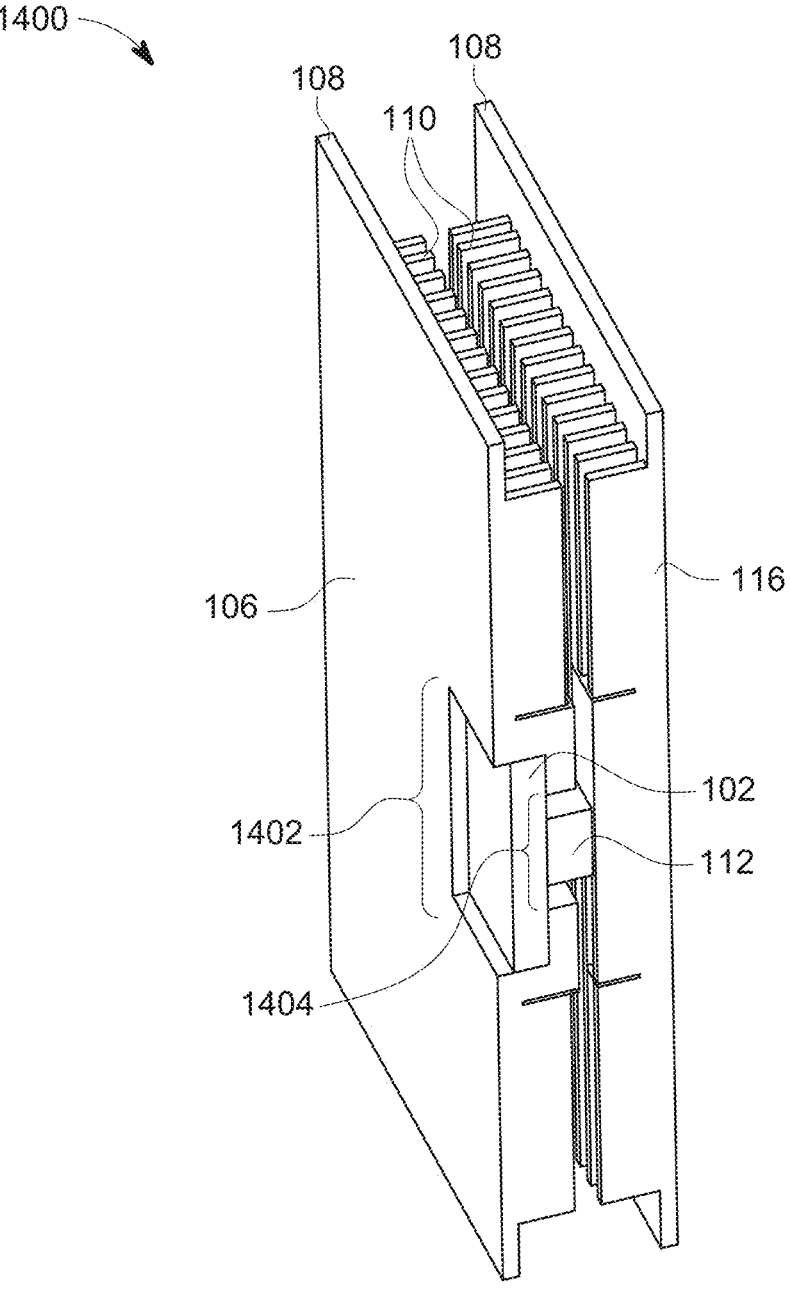
FIG. 19 illustrates another cross-sectional view of the thermal management system along line A-A shown in FIG. 17.

FIG. 16 illustrates a perspective view of another example of a thermal management system 1400. FIG. 17 illustrates a plan view of the thermal management system shown in FIG. 16. FIG. 18 illustrates a cross-sectional view of the thermal management system along line A-A shown in FIG. 17. FIG. 19 illustrates another cross-sectional view of the thermal management system along line A-A shown in FIG. 17. In contrast to the thermal management systems shown in FIGS. 1 through 15, the thermal management system shown in FIGS. 16 through 19 may not include a thermal spreader. Instead, the first thermal management assembly can include or hold the component in a recess 1402 formed in a side or surface of the first thermal management assembly that faces away from the second thermal management assembly. The recess may be sized to receive or seat the component in the recess with no part of the component extending or protruding outside of the recess. Alternatively, part of the component may extend outside of or protrude from the recess. In another example, an interior portion 1406 of the first thermal management assembly may be spaced apart from the protrusions of the first thermal management assembly by gaps 1408 and may be the thermal spreader.

As shown in FIGS. 18 and 19, a through hole 1404 may extend through the entire remaining thickness of the first thermal management assembly within the recess. The thickness of the first thermal management assembly at the recess may be smaller than the thickness of the heat pump from one contact surface 1414 of the heat pump to an opposite contact surface 1416 of the heat pump. This thickness of the heat pump may be larger than the thickness of the first thermal management assembly at the recess such that part of the heat pump is disposed within the through hole with a remainder of the heat pump extends out of or protrudes from the through hole.

The first and second thermal management assemblies face each other in that the protrusions from each thermal management assembly protrude from the bases of each thermal management assembly toward the other thermal management assembly. The gap between the thermal management assemblies is disposed between the protrusions such that the protrusions from the thermal management assemblies protrude toward each other but are separated from each other by the gap.

The heat pump may abut, engage, or directly contact the component on one side or surface of the heat pump and may abut, engage, or directly contact the second thermal management assembly on the opposite side or surface of the heat pump. In operation, separation of the protrusions of the thermal management assemblies across the gap can thermally isolate the thermal management assemblies from each other. This thermal isolation may allow for natural convection of a working fluid from one thermal management assembly to the other. This can aid and speed up cooling or heating of the component. For example, to cool the component, the heat pump may be powered to direct thermal energy into the second thermal management assembly. This thermal energy directed into the second thermal management assembly can create a difference in heat between the first and second thermal management assemblies. The heat pump can make the second thermal management assembly hotter than the first thermal management assembly, which can heat the working fluid around and/or between the protrusions of the second thermal management assembly more than the working fluid around and/or between the protrusions of the first thermal management assembly.

This heating of the working fluid around the second thermal management assembly can decrease the density of the working fluid between and/or around the protrusions of the second thermal management assembly (relative to the density of the working fluid between and/or around the protrusions of the first thermal management assembly). This difference in density can create a thermal head force or thermal driving head that helps move the working fluid from between and/or around the protrusions of the first thermal management assembly toward areas between and/or around the protrusions of the second thermal management assembly. Movement of the working fluid in this way can help refresh or replenish the working fluid between and/or around the protrusions of the first thermal management assembly with working fluid from outside of or away from the thermal management assemblies. This can help cool the first thermal management assembly faster than if the heat pump and/or second thermal management assembly were not arranged or operating in the manner described above. As a result, the component may be cooled faster and/or using a smaller volume of space for the components of the system relative to other thermal management systems.

As another example, to heat the component, the heat pump may be powered to direct thermal energy into the component. For example, the heat pump may generate heat on the side of the heat pump that faces and/or contacts the component. The heat pump also may cool the second thermal management assembly (as the side of the heat pump that is opposite the component may be cooled more than the side of the heat pump that faces the component). This can result in cooling of the working fluid between and/or around the protrusions of the second thermal management assembly. The cooling of this working fluid can increase the density of the working fluid around the second thermal management assembly relative to the working fluid around the first thermal management assembly. This difference in density can create a thermal head force or thermal driving head that helps move the working fluid from between and/or around the protrusions of the second thermal management assembly toward areas between and/or around the protrusions of the first thermal management assembly. Movement of the working fluid in this way can help refresh or replenish the working fluid between and/or around the protrusions of the second thermal management assembly with working fluid from outside of or away from the thermal management assemblies. This can help cool the second thermal management assembly faster than if the heat pump and/or first thermal management assembly were not arranged or operating in the manner described above. As a result, the component may be heated faster and/or using a smaller volume of space for the components of the system relative to other thermal management systems.

Figure 20:
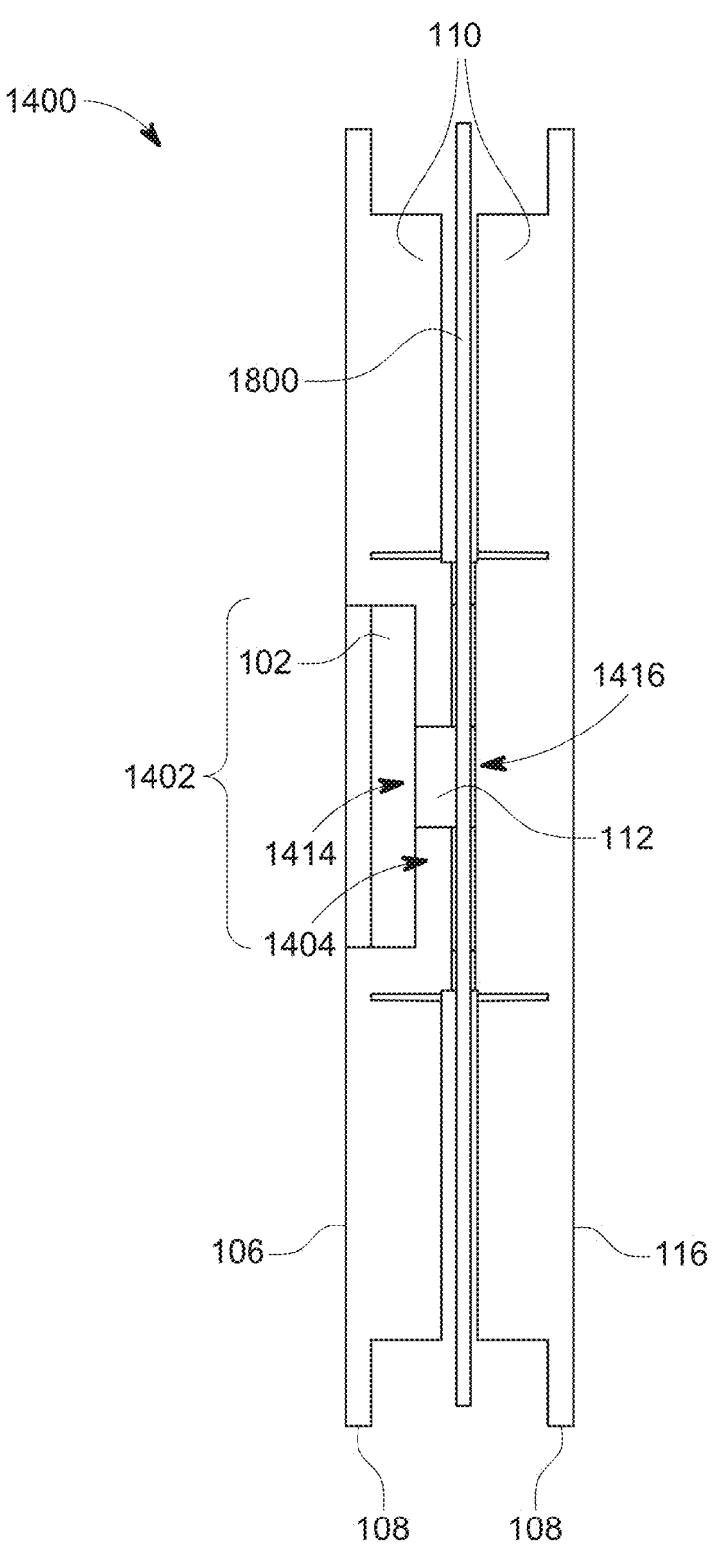
FIG. 20 illustrates a cross-sectional view of another example of the thermal management system shown in FIGS. 16 through 19 (taken along line 18-18 shown in FIG. 18)

FIG. 20 illustrates a cross-sectional view of another example of the thermal management system shown in FIGS. 16 through 19 (taken along line 18-18 shown in FIG. 18). The system shown in FIG. 20 may include a thermally insulative wall 1800 disposed in the gap between the first and second thermal management assemblies. This wall may be connected with one or more of the thermal management assemblies (e.g., by one or more bodies or bridges that connect the wall with the thermal management assembly or assemblies). In one example, the wall and the thermal management assemblies may be formed as a single, continuous body (e.g., via additive manufacturing, such as three dimensional printing) or may be formed from multiple different parts that are then joined together.

The wall can be formed of a material that is not thermally conductive, such as an electrically insulative material (e.g., a dielectric material). This can help thermally isolate the thermal management assemblies from each other. For example, the wall can reduce the heat that is transferred from one thermal management assembly to the other thermal management assembly across the gap. This can increase the difference in heat between the first and second thermal management assemblies which, in turn, may decrease the density of the working fluid between and/or around the protrusions of the second thermal management assembly (relative to the density of the working fluid between and/or around the protrusions of the first thermal management assembly). This, in turn, may increase the difference in density and create a greater thermal head force or thermal driving head that helps move more working fluid from between and/or around the protrusions of the first thermal management assembly toward areas between and/or around the protrusions of the second thermal management assembly. This can help cool the first thermal management assembly faster than if the wall were not provided.

As another example, the wall can help to heat the component by reducing the transfer of heat between the thermal management assemblies, thereby increasing the density of the working fluid around the second thermal management assembly relative to the working fluid around the first thermal management assembly. This difference in density can create a larger thermal head force or thermal driving head that helps move the working fluid from between and/or around the protrusions of the second thermal management assembly toward areas between and/or around the protrusions of the first thermal management assembly. Movement of the working fluid in this way can help refresh or replenish the working fluid between and/or around the protrusions of the second thermal management assembly with working fluid from outside of or away from the thermal management assemblies. This can help cool the second thermal management assembly faster than if the wall were not provided.

Figure 21:
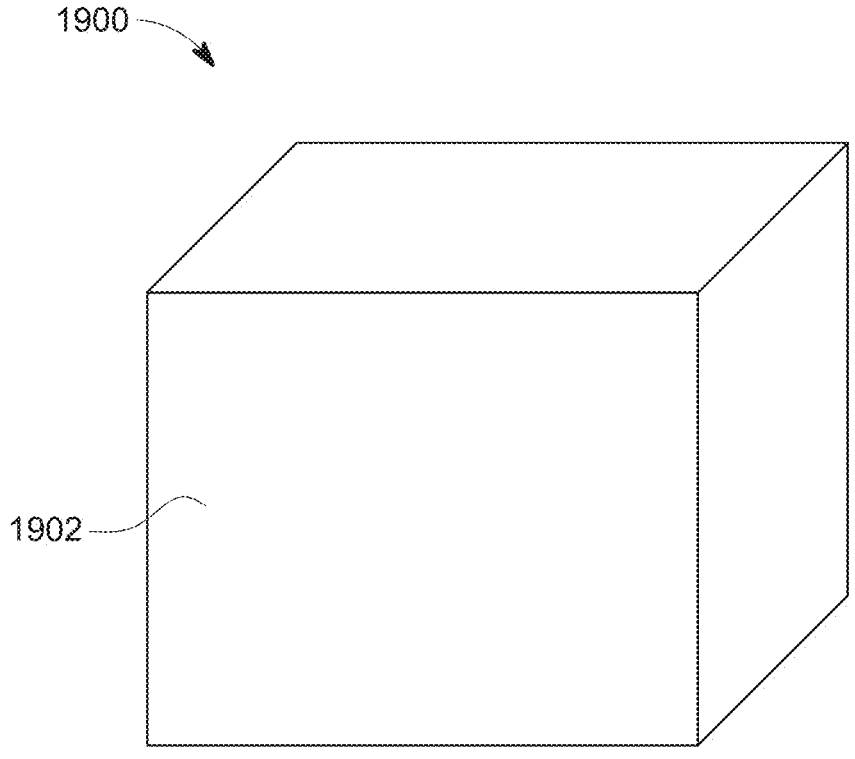
FIG. 21 illustrates another example of a thermal management device.

FIG. 21 illustrates another example of a thermal management device 1900. The device may include several of the thermal management systems 1902 that are joined or arranged together in a three dimensional structure. The systems 1902 can represent one or more of the thermal management systems described herein. For example, the device may form a closed box (having six sides) with each side formed from one or more of the thermal management systems described herein. Optionally, the device may form an open box (having five sides) with each side formed from one or more of the thermal management systems described herein. In another example, the device may include the thermal management systems arranged in another three dimensional shape that is not a box. The device may include two or more different ones of the thermal management systems described herein (e.g., on different sides or the same side of the device).

The thermal management systems can be arranged around an interior space of the device in which one or more of the components are disposed to heat or cool the component(s). For example, an electronic device or other component may be placed inside the device and the heat pumps may operate to heat or cool the electronic device or other component inside the device as described herein.

A method for manufacturing, fabricating, or creating one or more of the thermal management systems described herein may include additively manufacturing a three dimensional body. This process may involve printing or otherwise depositing successive layers of material on top of each other to form the shapes of the body or bodies of the thermal management system. Optionally, the body or bodies may be sintered, cured, or otherwise hardened after forming. In another example, the system may be formed by subtractive manufacturing.

One example of a thermal management system may include a thermal spreader that can be thermally coupled with a component, a solid state heat pump that can be thermally coupled with the component via the thermal spreader, and a first thermal management assembly that can be thermally coupled with the solid state heat pump. The first thermal management assembly may conduct the thermal energy between the component and an external environment via the solid state heat pump. The thermal management system also may include a second thermal management assembly that can be thermally coupled with the thermal spreader. The second thermal management assembly may conduct the thermal energy between the component and the external environment via the thermal spreader. The first thermal management assembly and the second thermal management assembly may be partially thermally isolated from each other such that a first portion of the thermal energy can be conducted between the component and the external environment via the first thermal management assembly and the solid state heat pump, and a second portion of the thermal energy can be conducted between the component and the external environment via the second thermal management assembly and the thermal spreader. The first portion and the second portion of the thermal energy may be at different temperatures to create convection movement of a working fluid between the second thermal management assembly and the first thermal management assembly.

The first thermal management assembly and the second thermal management assembly may be partially thermally isolated from each other by one or more of a spatial gap or a thermally insulative body that permits flow of the working fluid between the first thermal management assembly and the second thermal management assembly. The first thermal management assembly and the second thermal management assembly may be partially thermally isolated from each other by the spatial gap. The thermal management system also may include one or more stiffening bridges connecting the first thermal management assembly and the second thermal management assembly across the spatial gap.

Each of the first thermal management assembly and the second thermal management assembly can be or can include a heat sink having one or more fins, pins, or honeycomb structures that dissipate the thermal energy to the external environment or that receive the thermal energy from the external environment. The solid state heat pump, the thermal spreader, the first thermal management assembly, and the second thermal management assembly may cool the component and/or heat the component.

The thermal spreader may be disposed between the component and both the first thermal management assembly and the second thermal management assembly. The solid state heat pump can be disposed between the thermal spreader and the first thermal management assembly. One or both of the first thermal management assembly or the second thermal management assembly may include conduits through which the working fluid flows between the first thermal management assembly and the second thermal management assembly due to the convection movement of the working fluid. One or more of these conduits may be larger in or at the first thermal management assembly or the second thermal management assembly than in or at another of the first thermal management assembly or the second thermal management assembly.

The component may be a first component, and the solid state heat pump may be configured to be thermally coupled with the first component and one or more additional components by the thermal spreader. The thermal spreader can be an additively manufactured body. The solid state heat pump may be disposed between the first thermal management assembly and the second thermal management assembly. The second thermal management assembly can be disposed between the solid state heat pump and the component. The thermal management system optionally may also include a thermally insulative divider wall disposed between the first thermal management assembly and the second thermal management assembly.

The solid state heat pump, the first thermal management assembly, the second thermal management assembly, and the heat spreader can define a thermal management device. The thermal management system may include one or more additional ones of the thermal management device with the thermal management devices arranged in one or more three dimensional structures.

Another example of a thermal management system may include a solid state heat pump that can be thermally coupled with a component and a first thermal management assembly that can be thermally coupled with the solid state heat pump. The first thermal management assembly may conduct the thermal energy between the component and an external environment via the solid state heat pump. The thermal management system may include a second thermal management assembly that can be thermally coupled with the component. The second thermal management assembly may conduct the thermal energy between the component and the external environment. The first thermal management assembly can conduct a first portion of the thermal energy between the component and the external environment via the solid state heat pump. The second thermal management assembly may conduct a second portion of the thermal energy between the component and the external environment. The first portion and the second portion of the thermal energy can create convection movement of a working fluid between the second thermal management assembly and the first thermal management assembly.

The first thermal management assembly and the second thermal management assembly may be partially thermally isolated from each other by one or more of a spatial gap or an insulative wall. The thermal management system also may include a thermal spreader that can be thermally coupled with the component and disposed between the component and the first thermal management assembly. The heat pump can be disposed between the thermal spreader and the second thermal management assembly. The thermal spreader may include a cantilevered beam with the heat pump disposed between the beam and the second thermal management assembly. The thermal management system may include a fastener extending through the beam and into a receptacle in the second thermal management assembly. The fastener can secure the heat pump between the thermal spreader and the second thermal management assembly.

A method may include additively manufacturing the thermal management system described herein.

Use of phrases such as "one or more of . . . and," "one or more of . . . or," "at least one of . . . and," and "at least one of . . . or" are meant to encompass including only a single one of the items used in connection with the phrase, at least one of each one of the items used in connection with the phrase, or multiple ones of any or each of the items used in connection with the phrase. For example, "one or more of A, B, and C," "one or more of A, B, or C," "at least one of A, B, and C," and "at least one of A, B, or C" each can mean (1) at least one A, (2) at least one B, (3) at least one C, (4) at least one A and at least one B, (5) at least one A, at least one B, and at least one C, or (7) at least one A and at least one C.

As used herein, an element or step recited in the singular and preceded with the word "a" or "an" do not exclude the plural of said elements or operations, unless such exclusion is explicitly stated. Furthermore, references to "one embodiment" of the invention do not exclude the existence of additional embodiments that incorporate the recited features. Moreover, unless explicitly stated to the contrary, embodiments "comprising," "comprises," "including," "includes," "having," or "has" an element or a plurality of elements having a particular property may include additional such elements not having that property. In the appended claims, the terms "including" and "in which" are used as the plain-English equivalents of the respective terms "comprising" and "wherein." Moreover, in the following claims, the terms "first," "second," and "third," etc. are used merely as labels, and do not impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function devoid of further structure.

This written description uses examples to disclose several embodiments of the subject matter, including the best mode, and to enable one of ordinary skill in the art to practice the embodiments of subject matter, including making and using any devices or systems and performing any incorporated methods. The patentable scope of the subject matter is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. A system, comprising:
a thermal spreader thermally coupled with a component;
a solid state heat pump thermally coupled with the component via the thermal spreader;
a first thermal management assembly and a second thermal management assembly;
wherein the second thermal management assembly is thermally coupled with the solid state heat pump, the second thermal management assembly configured to conduct thermal energy between the component and an external environment via the solid state heat pump; and
wherein the first thermal management assembly is thermally coupled with the thermal spreader, the first thermal management assembly configured to conduct the thermal energy between the component and the external environment via the thermal spreader,
wherein the second thermal management assembly and the first thermal management assembly are partially thermally isolated from each other by a thermally insulative divider wall such that a first portion of the thermal energy is conducted between the component and the external environment via the second thermal management assembly and the solid state heat pump, and a second portion of the thermal energy is conducted between the component and the external environment via the first thermal management assembly and the thermal spreader,
the first portion and the second portion of the thermal energy being at different temperatures to create convection movement of a working fluid between the first thermal management assembly and the second thermal management assembly.

2. The system of claim 1, wherein the second thermal management assembly and the first thermal management assembly are partially thermally isolated from each other by one or more of a spatial gap or a thermally insulative body that permits flow of the working fluid between the second thermal management assembly and the first thermal management assembly.

3. The system of claim 2, wherein the second thermal management assembly and the first thermal management assembly are partially thermally isolated from each other by the spatial gap, and further comprising one or more stiffening bridges connecting the second thermal management assembly and the first thermal management assembly across the spatial gap.

4. The system of claim 1, wherein each of the second thermal management assembly and the first thermal management assembly is a heat sink having one or more fins, pins, or honeycomb structures that dissipate the thermal energy to the external environment or that receive the thermal energy from the external environment.

5. The system of claim 1, wherein the solid state heat pump, the thermal spreader, the second thermal management assembly, and the first thermal management assembly are configured to operate to cool the component.

6. The system of claim 1, wherein the solid state heat pump, the thermal spreader, the second thermal management assembly, and the first thermal management assembly are configured to operate to heat the component.

7. The system of claim 1, wherein the thermal spreader is disposed between the component and both the second thermal management assembly and the first thermal management assembly, and the solid state heat pump is disposed between the thermal spreader and the second thermal management assembly.

8. The system of claim 1, wherein one or both of the second thermal management assembly or the first thermal management assembly includes conduits through which the working fluid flows between the second thermal management assembly and the first thermal management assembly due to the convection movement of the working fluid.

9. The system of claim 8, wherein one or more of the conduits are larger in or at the second thermal management assembly or the first thermal management assembly than in or at another of the second thermal management assembly or the first thermal management assembly.

10. The system of claim 1, wherein the component is a second component, and the solid state heat pump is thermally coupled with the second component and one or more additional components by the thermal spreader.

11. The system of claim 1, wherein the thermal spreader is an additively manufactured body.

12. The system of claim 1, wherein the solid state heat pump is disposed between the second thermal management assembly and the first thermal management assembly, and the first thermal management assembly is disposed between the solid state heat pump and the component.

13. The system of claim 1, wherein the solid state heat pump, the second thermal management assembly, the first thermal management assembly, and the thermal spreader define a thermal management device, and further comprising one or more additional ones of the thermal management device with the thermal management devices arranged in one or more three dimensional structures.

14. A method comprising:
additively manufacturing the system according to claim 1.

15. A system, comprising:
a solid state heat pump thermally coupled with a component;
a first thermal management assembly and a second thermal management assembly:
wherein the second thermal management assembly is thermally coupled with the solid state heat pump, the second thermal management assembly configured to conduct thermal energy between the component and an external environment via the solid state heat pump; and
wherein the first thermal management assembly is thermally coupled with the component, the first thermal management assembly configured to conduct the thermal energy between the component and the external environment, wherein the second thermal management assembly is configured to conduct a first portion of the thermal energy between the component and the external environment via the solid state heat pump, the first thermal management assembly configured to conduct a second portion of the thermal energy between the component and the external environment, wherein the first portion and the second portion of the thermal energy create convection movement of a working fluid between the first thermal management assembly and the second thermal management assembly, and wherein the second thermal management assembly and the first thermal management assembly are partially thermally isolated from each other by an insulative wall.

16. The system of claim 15, further comprising a thermal spreader thermally coupled with the component and disposed between the component and the second thermal management assembly, the heat pump disposed between the thermal spreader and the first thermal management assembly.

17. A system, comprising:

a solid state heat pump thermally coupled with a component;

a first thermal management assembly and a second thermal management assembly;

wherein the second thermal management assembly is thermally coupled with the solid state heat pump, the second thermal management assembly configured to conduct thermal energy between the component and an external environment via the solid state heat pump;

wherein the first thermal management assembly is thermally coupled with the component, the first thermal management assembly configured to conduct the thermal energy between the component and the external environment;

wherein the second thermal management assembly is configured to conduct a first portion of the thermal energy between the component and the external environment via the solid state heat pump, the first thermal management assembly configured to conduct a second portion of the thermal energy between the component and the external environment;

wherein the first portion and the second portion of the thermal energy create convection movement of a working fluid between the first thermal management assembly and the second thermal management assembly;

wherein the system further comprises a thermal spreader thermally coupled with the component and disposed between the component and the second thermal management assembly, the heat pump disposed between the thermal spreader and the first thermal management assembly; and wherein the thermal spreader includes a cantilevered beam with the heat pump disposed between the beam and the first thermal management assembly.

18. The system of claim 17, further comprising a fastener extending through the beam and into a receptacle in the first thermal management assembly, the fastener securing the heat pump between the thermal spreader and the first thermal management assembly.

19. A system, comprising:

a thermal spreader thermally coupled with a component;

a solid state heat pump thermally coupled with the component via the thermal spreader;

a first thermal management assembly and a second thermal management assembly;

wherein the second thermal management assembly is thermally coupled with the solid state heat pump, the second thermal management assembly configured to conduct thermal energy between the component and an external environment via the solid state heat pump; and wherein the first thermal management assembly is thermally coupled with the thermal spreader, the first thermal management assembly configured to conduct the thermal energy between the component and the external environment via the thermal spreader, wherein the second thermal management assembly and the first thermal management assembly are partially thermally isolated from each other by a thermally insulative divider wall such that a first portion of the thermal energy is conducted between the component and the external environment via the second thermal management assembly and the solid state heat pump, and a second portion of the thermal energy is conducted between the component and the external environment via the first thermal management assembly and the thermal spreader, the first portion and the second portion of the thermal energy being at different temperatures to create convection movement of a working fluid between the first thermal management assembly and the second thermal management assembly;

wherein the solid state heat pump is disposed between the second thermal management assembly and the first thermal management assembly, and the first thermal management assembly is disposed between the solid state heat pump and the component; and wherein the system further comprises a thermally insulative divider wall disposed between the second thermal management assembly and the first thermal management assembly.

* * * * *